(12) United States Patent
Katoch et al.

(10) Patent No.: US 12,217,792 B2
(45) Date of Patent: Feb. 4, 2025

(54) MEMORY CIRCUIT AND METHOD OF OPERATING SAME

(71) Applicant: TAIWAN SEMICONDUCTOR MANUFACTURING COMPANY, LTD., Hsinchu (TW)

(72) Inventors: Atul Katoch, Hsinchu (TW); Sahil Preet Singh, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 52 days.

(21) Appl. No.: 17/744,428

(22) Filed: May 13, 2022

(65) Prior Publication Data
US 2023/0245694 A1    Aug. 3, 2023

Related U.S. Application Data

(60) Provisional application No. 63/267,453, filed on Feb. 2, 2022.

(51) Int. Cl.
| | |
|---|---|
| *G11C 11/4096* | (2006.01) |
| *G11C 11/4076* | (2006.01) |
| *G11C 11/4091* | (2006.01) |
| *G11C 11/4094* | (2006.01) |
| *G11C 11/4099* | (2006.01) |

(52) U.S. Cl.
CPC ...... *G11C 11/4096* (2013.01); *G11C 11/4076* (2013.01); *G11C 11/4091* (2013.01); *G11C 11/4094* (2013.01); *G11C 11/4099* (2013.01)

(58) Field of Classification Search
CPC ............ G11C 11/4096; G11C 11/4076; G11C 11/4091; G11C 11/4094; G11C 11/4099; G11C 7/08; G11C 7/1048; G11C 7/18; G11C 8/12; G11C 11/4097; G11C 11/419; G11C 16/0483; G11C 8/14; G11C 16/24; G11C 7/06; G11C 7/12; G11C 7/22; G11C 11/412

USPC ...................................................... 365/185.13
See application file for complete search history.

(56) References Cited

U.S. PATENT DOCUMENTS

| 5,835,432 A | 11/1998 | Nakano |
| 9,911,473 B1 | 3/2018 | Singh et al. |
| 2020/0005837 A1* | 1/2020 | Katoch .................. G11C 7/106 |

FOREIGN PATENT DOCUMENTS

| KR | 10-2020-0002647 | 1/2020 |
| TW | 201820323 | 6/2018 |

* cited by examiner

*Primary Examiner* — Fernando Hidalgo
(74) *Attorney, Agent, or Firm* — Hauptman Ham, LLP

(57) ABSTRACT

A memory circuit includes a set of memory cells configured to store data, and a local input output (LIO) circuit coupled to a global bit line and the set of memory cells. The LIO circuit includes a sense amplifier, a driver circuit and a booster circuit. The sense amplifier is configured to sense a first signal in response to at least a sense amplifier signal. The first signal corresponds to a value of the data stored in the set of memory cells. The driver circuit is configured to generate a global bit line signal in response to at least the first signal or an inverted first signal. The booster circuit is coupled to the driver circuit and the global bit line, and configured to adjust the global bit line signal in response to a delayed global bit line signal.

20 Claims, 13 Drawing Sheets

MEMORY CIRCUIT AND METHOD OF OPERATING SAME

PRIORITY CLAIM

This application claims the benefit of U.S. Provisional Application No. 63/267,453, filed Feb. 2, 2022, which is herein incorporated by reference in its entirety.

BACKGROUND

The semiconductor integrated circuit (IC) industry has produced a wide variety of digital devices to address issues in a number of different areas. Some of these digital devices, such as memory macros, are configured for the storage of data. As ICs have become smaller and more complex, the resistance of conductive lines within these digital devices is also changed affecting the operating voltages of these digital devices and overall IC performance.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
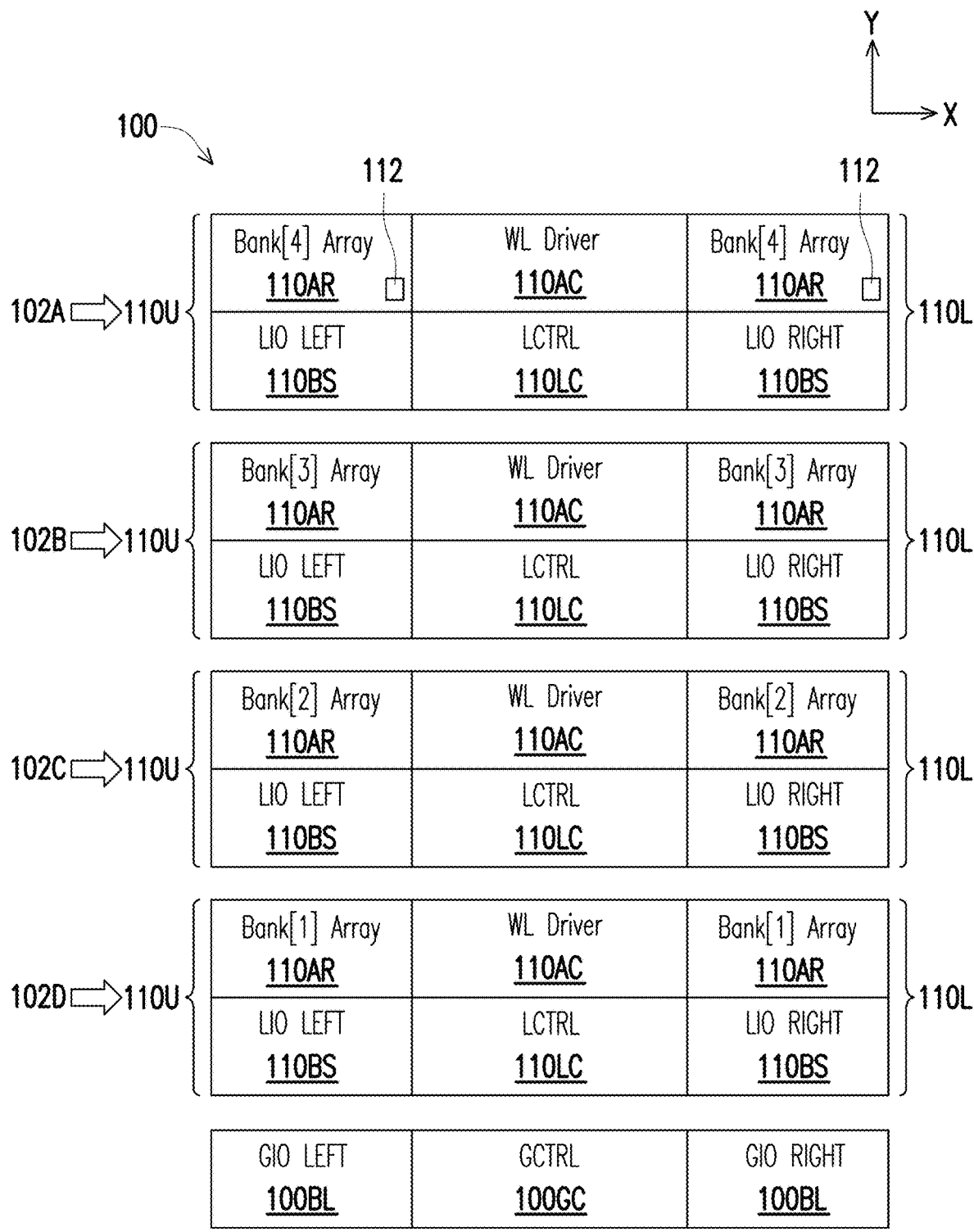
FIG. 1 is a block diagram of a memory circuit, in accordance with some embodiments.

The following disclosure provides different embodiments, or examples, for implementing features of the provided subject matter. Specific examples of components, materials, values, steps, arrangements, or the like, are described below to simplify the present disclosure. These are, of course, examples and are not limiting. Other components, materials, values, steps, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with some embodiments, a memory circuit includes a set of memory cells configured to store data, and a local input output (LIO) circuit coupled to a global bit line and the set of memory cells.

In some embodiments, the LIO circuit includes a sense amplifier configured to sense a first signal in response to at least a sense amplifier signal. In some embodiments, the first signal corresponds to a value of the data stored in the set of memory cells.

In some embodiments, the LIO circuit further includes a driver circuit configured to generate a global bit line signal in response to at least the first signal or an inverted first signal.

In some embodiments, the LIO circuit further includes a booster circuit coupled to the driver circuit and the global bit line. In some embodiments, the booster circuit is configured to adjust the global bit line signal in response to a delayed global bit line signal.

In some embodiments, the driver circuit is configured to cause a rising edge or a falling edge transition of the global bit line signal during a read operation of one or more memory cells in the set of memory cells. In some embodiments, in response to the rising edge or the falling edge transition of the global bit line signal, the booster circuit 406 causes the rising edge or the falling edge transition of the read global bit line signal to transition faster than other approaches without the booster circuit, thereby resulting in faster read operations than other approaches without the booster circuit.

FIG. 1 is a block diagram of a memory circuit 100, in accordance with some embodiments.

FIG. 1 is simplified for the purpose of illustration. In some embodiments, memory circuit 100 includes various elements in addition to those depicted in FIG. 1 or is otherwise arranged so as to perform the operations discussed below.

Memory circuit 100 is an IC that includes memory partitions 102A-102D, a global control circuit 100GC and global input output (GIO) circuits 100BL.

Each memory partition 102A-102D includes memory banks 110U and 110L adjacent to a word line (WL) driver circuit 110AC and a local control circuit 110LC. Each memory bank 110U and 110L includes a memory cell array 110AR and a local input output (LIO) circuit 110BS.

A memory partition, e.g., a memory partition 102A-102D, is a portion of memory circuit 100 that includes a subset of memory devices (not shown in FIG. 1) and adjacent circuits configured to selectively access the subset of memory devices in program and read operations. In the embodiment depicted in FIG. 1, memory circuit 100 includes a total of four partitions. In some embodiments, memory circuit 100 includes a total number of partitions greater or fewer than four.

GIO circuit 100BL is a circuit configured to control access to one or more electrical paths, e.g., bit lines, to each memory device of the corresponding memory bank 110U or 110L of each memory partition 102A-102D, e.g., by generating one or more bit line signals. In some embodiments, GIO circuit 100BL includes a global bit line driver circuit. In some embodiments, GIO circuit 100BL is coupled to each memory bank 110U and 110L by a corresponding global bit line (e.g., shown in FIG. 2 as RGBL or RGBLB).

Global control circuit 100GC is a circuit configured to control some or all of program and read operations on each memory partition 102A-102D, e.g., by generating and/or outputting one or more control and/or enable signals.

In some embodiments, global control circuit 100GC includes one or more analog circuits configured to interface with memory partitions 102A-102D, cause data to be programmed in one or more memory devices, and/or use data received from one or more memory devices in one or more circuit operations. In some embodiments, global control circuit 100GC includes one or more global address decode or pre-decoder circuits configured to output one or more address signals to the WL driver circuit 110AC of each memory partition 102A-102D.

Each WL driver circuit 110AC is configured to generate word line signals on corresponding word lines WL. In some embodiments, each WL driver circuit 110AC is configured to output word line signals on corresponding word lines WL to the adjacent memory banks 110U and 110L of the corresponding memory partition 102A-102D.

Each local control circuit 110LC is an electronic circuit configured to receive one or more address signals. Each local control circuit 110LC is configured to generate signals corresponding to adjacent subsets of memory devices identified by the one or more address signals. In some embodiments, the adjacent subsets of memory devices correspond to columns of memory devices. In some embodiments, each local control circuit 110LC is configured to generate each signal as a complementary pair of signals. In some embodiments, each local control circuit 110LC is configured to output the signals to corresponding word line driver circuits within the adjacent WL driver circuit 110AC of the corresponding memory partition 102A-102D. In some embodiments, the local control circuit 110LC includes a bank decoder circuit.

Each LIO circuit 110BS is configured to selectively access one or more bit lines (shown in FIG. 2) coupled to adjacent subsets of memory devices of the corresponding memory cell array 110AR responsive to GIO circuit 100BL, e.g., based on one or more BL control signals. In some embodiments, the adjacent subsets of memory devices correspond to rows of memory devices. In some embodiments, the LIO circuit 110BS includes a bit line selection circuit.

Each memory bank 110U and 110L includes the corresponding memory cell array 110AR including memory cells or memory devices 112 configured to be accessed in program and read operations by the adjacent LIO circuit 110BS and the adjacent WL driver circuit 110AC.

Each memory cell array 110AR includes an array of memory devices 112 having N rows and M columns, where M and N are positive integers. The rows of cells in memory cell array 102 are arranged in a first direction X. The columns of cells in memory cell array 102 are arranged in a second direction Y. The second direction Y is different from the first direction X. In some embodiments, the second direction Y is perpendicular to the first direction X. In some embodiments, each memory cell array 110AR is divided into an upper region and a lower region (shown in FIG. 2).

Memory device 112 is shown in memory bank 110U and 110L of memory partition 102A. For ease of illustration, memory device 112 is not shown in memory bank 110U and 110L of memory partitions 102B, 102C and 102D.

Memory device 112 is an electrical, electromechanical, electromagnetic, or other device configured to store bit data represented by logical states. At least one logical state of memory device 112 is capable of being programmed in a write operation and detected in a read operation. In some embodiments, a logical state corresponds to a voltage level of an electrical charge stored in a given memory device 112. In some embodiments, a logical state corresponds to a physical property, e.g., a voltage, a current, a resistance or a magnetic orientation, of a component of a given memory device 112.

In some embodiments, memory device 112 includes one or more single port (SP) static random access memory (SRAM) cells. In some embodiments, memory device 112 includes one or more dual port (DP) SRAM cells. In some embodiments, memory device 112 includes one or more multi-port SRAM cells. Different types of memory cells in memory device 112 are within the contemplated scope of the present disclosure. In some embodiments, memory device 112 includes one or more dynamic random access memory (DRAM) cells. In some embodiments, memory device 112 includes one or more one-time programmable (OTP) memory devices such as electronic fuse (eFuse) or anti-fuse devices, flash memory devices, random-access memory (RAM) devices, resistive RAM devices, ferroelectric RAM devices, magneto-resistive RAM devices, erasable programmable read only memory (EPROM) devices, electrically erasable programmable read only memory (EEPROM) devices, or the like. In some embodiments, memory device 112 is an OTP memory device including one or more OTP memory cells.

Other configurations of memory circuit 100 are within the scope of the present disclosure.

Figure 2:
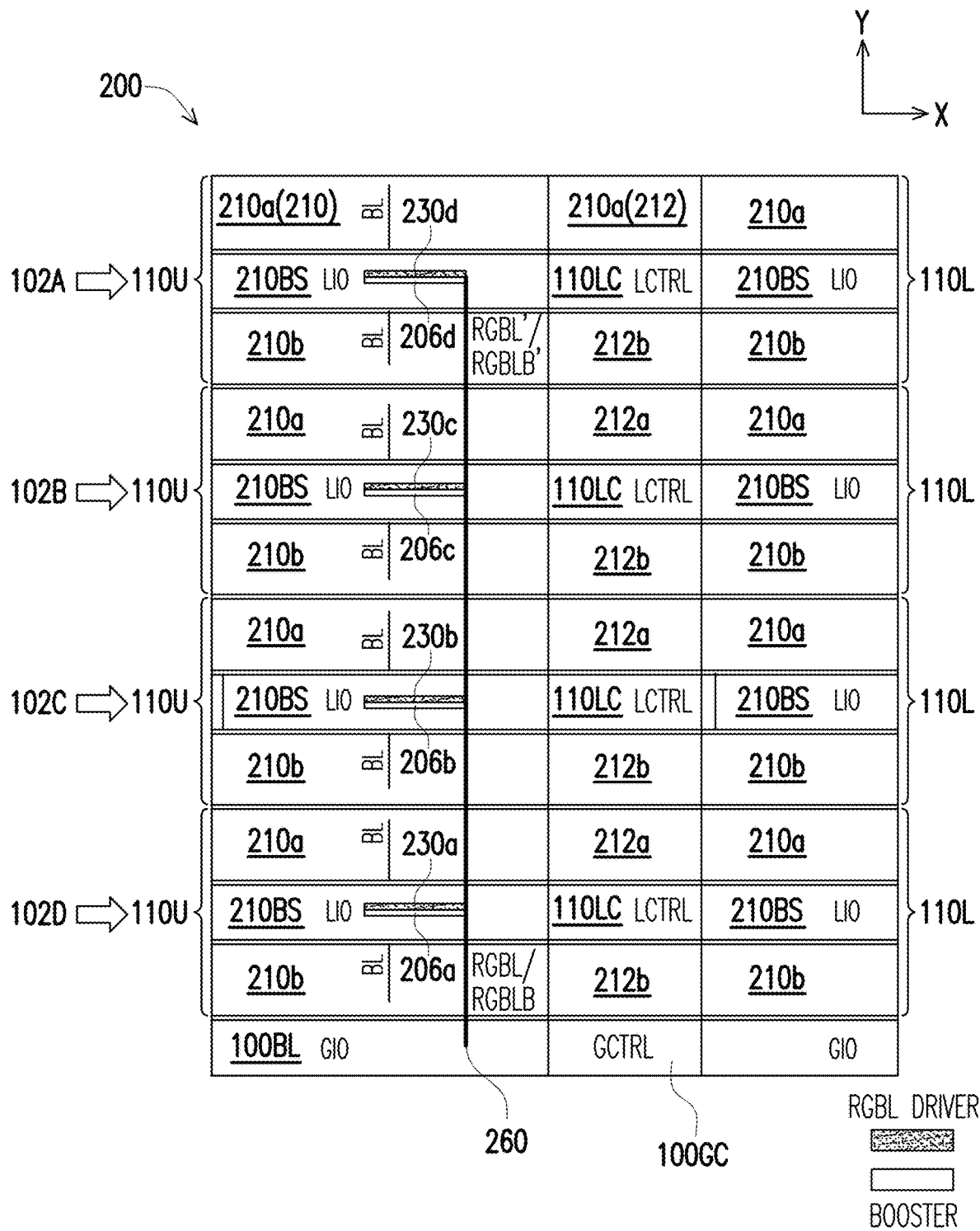
FIG. 2 is a circuit diagram of a memory circuit, in accordance with some embodiments.

FIG. 2 is a circuit diagram of a memory circuit 200, in accordance with some embodiments.

Memory circuit 200 is an embodiment of memory circuit 100 of FIG. 1, and similar detailed description is therefore omitted. For example, LIO circuit 210BS of memory circuit 200 is an embodiment of LIO circuit 110BS.

Memory circuit 200 includes memory partitions 102A-102D, global control circuit 100GC, GIO circuits 100BL and a conductive line 260.

Each memory partition 102A-102D includes memory banks 110U and 110L adjacent to a WL driver circuit 212 and a local control circuit 110LC. Each memory bank 110U and 110L includes a memory cell array 210 and a LIO circuit 210BS.

In comparison with memory circuit 100 of FIG. 1, each memory cell array 210 is an embodiment of memory cell array 110AR, each LIO circuit 210BS is an embodiment of LIO circuit 110BS, and each of WL driver circuit 212 is an embodiment of WL driver circuit 110AC, and similar detailed description is therefore omitted.

In comparison with each memory cell array 110AR of FIG. 1, each memory cell array 210 is divided into an upper region of memory cells 210a and a lower region of memory cells 210b, and similar detailed description is therefore omitted.

In comparison with each WL driver circuit 110AC of FIG. 1, each WL driver circuit 212 is divided into WL driver circuit 212a and WL driver circuit 212b, and similar detailed description is therefore omitted.

LIO circuit 210BS in memory partition 102A includes a booster circuit 206d and a RGBL driver circuit 230d. LIO circuit 210BS in memory partition 102B includes a booster circuit 206c and a RGBL driver circuit 230c. LIO circuit 210BS in memory partition 102C includes a booster circuit 206b and a RGBL driver circuit 230b. LIO circuit 210BS in memory partition 102D includes a booster circuit 206a and a RGBL driver circuit 230a.

Each booster circuit 206a, 206b, 206c or 206d is coupled to a corresponding RGBL driver circuit 230a, 230b, 230c or 230d. Each of the booster circuits 206a, 206b, 206c or 206d and the corresponding RGBL driver circuits 230a, 230b, 230c or 230d are coupled to the GIO circuit 100BL by conductive line 260.

Conductive line 260 extends in the second direction Y. Conductive line 260 extends from the GIO circuit 100BL to memory partition 102A. Conductive line 260 overlaps at least a portion of the GIO circuit 100BL, memory partitions 102B-102D and at least a portion of memory partition 102A. In some embodiments, conductive line 260 is referred to as a global bit line GBL. The global bit line GBL has a global bit line signal GBL'. In some embodiments, conductive line 260 is referred to as a read global bit line RGBL, and has a corresponding read global bit line signal RGBL'. In some embodiments, conductive line 260 is referred to as a global bit line bar GBLB. The global bit line bar GBLB has a global bit line bar signal GBLB'. In some embodiments, conductive line 260 is referred to as a read global bit line bar RGBLB, and has a corresponding read global bit line bar signal RGBLB'. In some embodiments, conductive line 260 extends in the second direction Y across each of the memory partitions 102A-102D of memory circuit 200.

Each RGBL driver circuit 230a, 230b, 230c or 230d is coupled to the read global bit line RGBL or the read global bit line bar RGBLB. Each RGBL driver circuit 230a, 230b, 230c or 230d is configured to generate a global bit line signal GBL' or a global bit line bar signal GBLB'. In some embodiments, each RGBL driver circuit 230a, 230b, 230c or 230d is configured to set the global bit line signal GBL' or global bit line bar signal GBLB' in response to a corresponding value of datum stored in the corresponding memory cell within the corresponding memory partition 102A, 102B, 102C or 102D. In some embodiments, at least one of RGBL driver circuit 230a, 230b, 230c or 230d is configured to cause a transition of the global bit line signal GBL' or global bit line bar signal GBLB' in response to the corresponding value of datum stored in the corresponding memory cell within the corresponding memory partition 102A, 102B, 102C or 102D.

Each booster circuit 206a, 206b, 206c or 206d is coupled to the read global bit line RGBL or the read global bit line bar RGBLB. In some embodiments, during a read operation of one or more memory cells in corresponding memory partition 102A, 102B, 102C or 102D, the corresponding booster circuit 206a, 206b, 206c or 206d is configured to adjust the read global bit line signal RGBL' in response to a transition of the corresponding read global bit line signal RGBL' and a corresponding delayed read global bit line signal (e.g., signal S2 in FIGS. 4-7). In some embodiments, during a read operation of one or more memory cells in corresponding memory partition 102A, 102B, 102C or 102D, the corresponding booster circuit 206a, 206b, 206c or 206d is configured to adjust a rising edge or a falling edge of the read global bit line signal RGBL' in response to the transition of the corresponding read global bit line signal RGBL' and the corresponding delayed read global bit line signal (e.g., signal S2 in FIGS. 4-7).

In some embodiments, during a read operation of one or more memory cells in corresponding memory partition 102A, 102B, 102C or 102D, the corresponding booster circuit 206a, 206b, 206c or 206d is configured to adjust the read global bit line bar signal RGBLB' in response to a transition of the corresponding read global bit line bar signal RGBLB' and a corresponding delayed read global bit line bar signal (e.g., signal S2 in FIGS. 4-7). In some embodiments, during a read operation of one or more memory cells in corresponding memory partition 102A, 102B, 102C or 102D, the corresponding booster circuit 206a, 206b, 206c or 206d is configured to adjust a rising edge or a falling edge of the read global bit line bar signal RGBLB' in response to the transition of the corresponding read global bit line bar signal RGBLB' and the corresponding delayed read global bit line bar signal (e.g., signal S2 in FIGS. 4-7).

In some embodiments, during a read operation of one or more memory cells in corresponding memory partition 102A, 102B, 102C or 102D, a transition of the corresponding read global bit line signal RGBL' or the read global bit line bar signal RGBLB' from logically low to logically high causes the corresponding booster circuit 206a, 206b, 206c or 206d to thereby cause the transition of the corresponding read global bit line signal RGBL' or read global bit line bar signal RGBLB' from logically low to logically high (e.g., rising edge) to be increased or improved compared to other approaches, thereby resulting in timing improvements of memory circuit 200 during one or more read operations.

In some embodiments, during a read operation of one or more memory cells in corresponding memory partition 102A, 102B, 102C or 102D, a transition of the corresponding read global bit line signal RGBL' or the read global bit line bar signal RGBLB' from logically high to logically low causes the corresponding booster circuit 206a, 206b, 206c or 206d to thereby cause the transition of the corresponding read global bit line signal RGBL' or read global bit line bar signal RGBLB' from logically high to logically low (e.g., falling edge) to be increased or improved compared to other approaches, thereby resulting in timing improvements of memory circuit 200 during one or more read operations.

In some embodiments, booster circuits 206a, 206b, 206c and 206d, RGBL driver circuits 230a, 230b, 230c and 230d, and conductive line 260 are shown as being configured for the left-side portion of memory circuit 200 for ease of illustration. However, in some embodiments, memory circuit 200 is configured such that circuits similar to the booster circuits 206a, 206b, 206c and 206d, RGBL driver circuits 230a, 230b, 230c and 230d, and conductive line 260 are included in the right-side portion of memory circuit 200, are not shown for ease of illustration, and similar detailed description is therefore omitted.

Other configurations of memory circuit 200 are within the scope of the present disclosure.

Memory Cell

Figure 3:
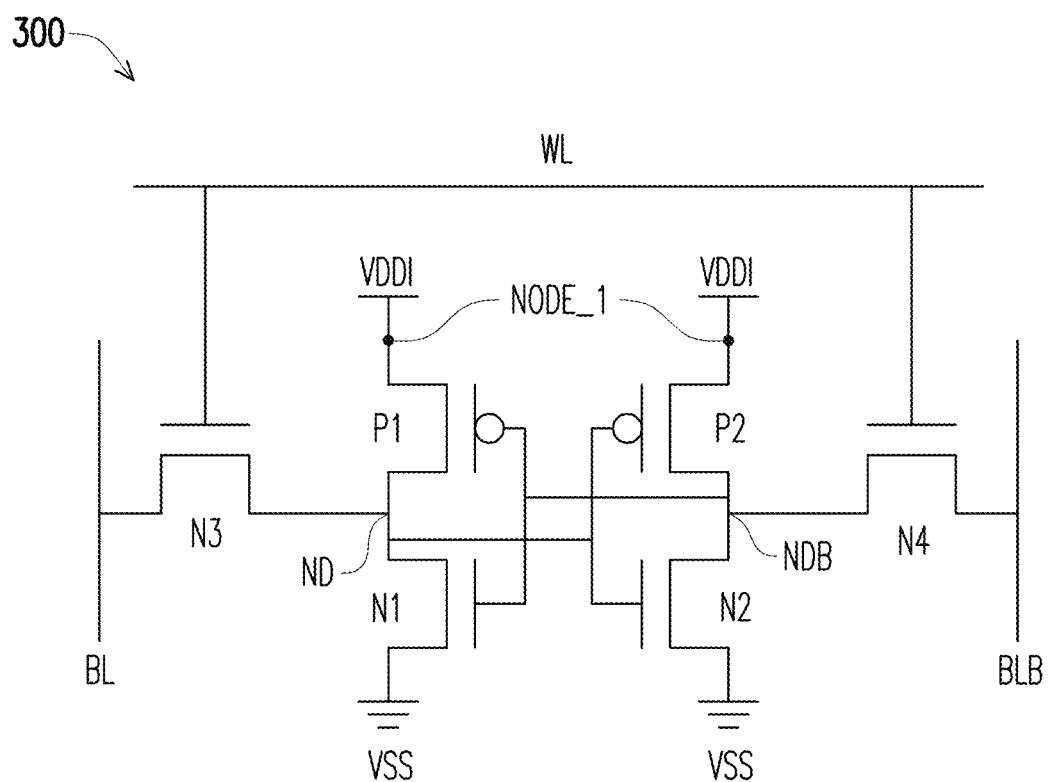
FIG. 3 is a circuit diagram of a memory cell usable in FIGS. 1 and 2, in accordance with some embodiments.

FIG. 3 is a circuit diagram of a memory cell 300 usable in FIGS. 1 and 2, in accordance with some embodiments.

Memory cell 300 is usable as one or more memory cells MCB in at least one of memory cell array 110AR of FIG. 1, memory device 112 of FIG. 1, memory cell array 210a of FIG. 2 or memory cell array 210b of FIG. 2.

Memory cell 300 is a six transistor (6T) single port (SP) SRAM memory cell used for illustration. In some embodiments, memory cell 300 employs a number of transistors other than six. Other types of memory are within the scope of various embodiments.

Memory cell 300 comprises two P-type metal oxide semiconductor (PMOS) transistors P1 and P2, and four N-type metal oxide semiconductor (NMOS) transistors N1, N2, N3, and N4. Transistors P1, P2, N1, and N2 form a cross latch or a pair of cross-coupled inverters. For example, PMOS transistor P1 and NMOS transistor N1 form a first inverter while PMOS transistor P2 and NMOS transistor N2 form a second inverter.

A source terminal of each of PMOS transistors P1 and P2 are configured as a voltage supply node NODE_1. Each voltage supply node NODE_1 is coupled to a first voltage source VDDI. A drain terminal of PMOS transistor P1 is coupled with a drain terminal of NMOS transistor N1, a gate terminal of PMOS transistor P2, a gate terminal of NMOS transistor N2, and a source terminal of NMOS transistor N3, and is configured as a storage node ND.

A drain terminal of PMOS transistor P2 is coupled with a drain terminal of NMOS transistor N2, a gate terminal of PMOS transistor P1, a gate terminal of NMOS transistor N1, and a source terminal of NMOS transistor N4, and is configured as a storage node NDB. A source terminal of each of NMOS transistors N1 and N2 is configured as a supply reference voltage node (not labelled) having a supply reference voltage VSS. The source terminal of each of NMOS transistors N1 and N2 is also coupled to supply reference voltage VSS.

A word line WL is coupled with a gate terminal of each of NMOS transistors N3 and N4. Word line WL is also called a write control line because NMOS transistors N3 and N4 are configured to be controlled by a signal on word line WL in order to transfer data between bit lines BL, BLB and corresponding nodes ND, NDB.

A drain terminal of NMOS transistor N3 is coupled to a bit line BL. A drain terminal of NMOS transistor N4 is coupled to a bit line BLB. Bit lines BL and BLB are configured as both data input and output for memory cell 300. In some embodiments, in a write operation, applying a logical value to a first bit line BL and the opposite logical value to the other bit line BLB enables writing the logical values on the bit lines to memory cell 300. Each of bit lines BL and BLB is called a data line because the data carried on bit lines BL and BLB are written to and read from corresponding nodes ND and NDB.

Word line WL corresponds to one or more word lines WL in FIG. 2. Bit line BL corresponds to one or more bit lines BL in FIG. 2. Bit line bar BLB corresponds to one or more bit line bars BLB in FIG. 2.

Other configurations of memory cell 300 are within the scope of the present disclosure.

Memory Circuit

Figure 4:
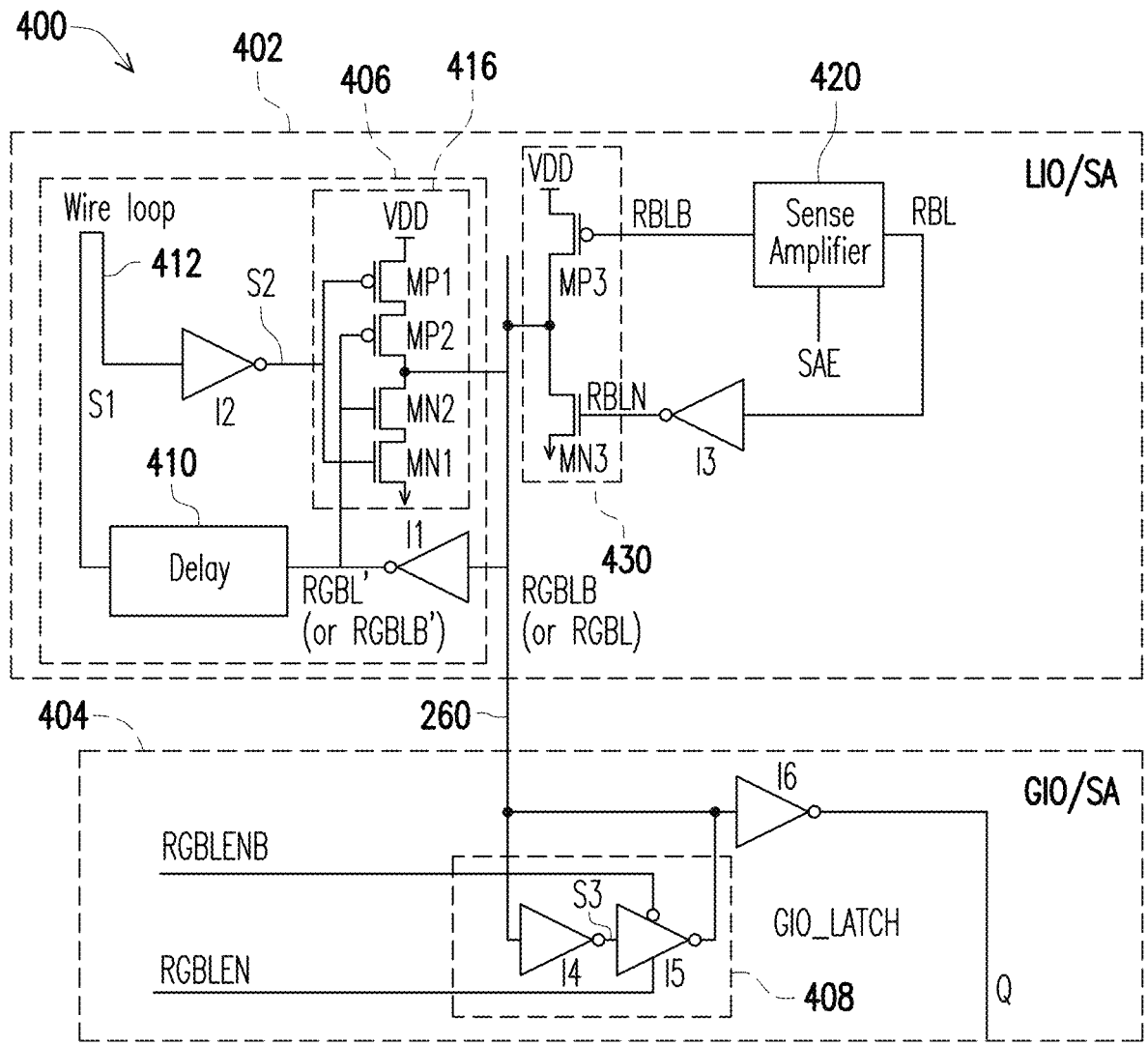
FIG. 4 is a circuit diagram of a memory circuit, in accordance with some embodiments.

FIG. 4 is a circuit diagram of a memory circuit 400, in accordance with some embodiments.

Memory circuit 400 is an embodiment of LIO circuit 210BS and GIO circuit 100BL of FIG. 2, and similar detailed description is therefore omitted. For example, memory circuit 400 illustrates a non-limiting example where an LIO circuit 402 of FIG. 4 is an embodiment of LIO circuit 210BS of FIG. 2, and a GIO circuit 404 of FIG. 4 is an embodiment of GIO circuit 100BL of FIG. 2, and similar detailed description is therefore omitted.

Memory circuit 400 includes LIO circuit 402 coupled to GIO circuit 404 by conductive line 260. In some embodiments, conductive line 260 is a read global bit line bar RGBLB. For ease of illustration and brevity, FIGS. 4-7 are described with conductive line 260 as the read global bit line bar RGBLB. In some embodiments, conductive line 260 is a read global bit line RGBL.

LIO circuit 402 includes a booster circuit 406, a sense amplifier 420, an inverter I3, and a driver circuit 430.

In comparison with memory circuit 200 of FIG. 2, booster circuit 406 is an embodiment of at least one of booster circuit 206a, 206b, 206c or 206d, driver circuit 430 is an embodiment of at least one of driver circuit 230a, 230b, 230c or 230d, and similar detailed description is therefore omitted.

Booster circuit 406 is coupled to the read global bit line bar RGBLB. Booster circuit 406 is configured to adjust a rising edge or a falling edge of the read global bit line bar signal RGBLB' in response to a signal S2 and a transition of the corresponding read global bit line bar signal RGBLB'.

Booster circuit 406 includes an inverter I1, a delay circuit 410, an inverter I2 and a feedback circuit 416.

Inverter I1 is configured to generate a signal RGBL' in response to the read global bit line bar signal RGBLB'. In some embodiments, the signal RGBL' is inverted from the read global bit line bar signal RGBLB'. An input terminal of inverter I1 is coupled to the read global bit line bar RGBLB, and is configured to receive the read global bit line bar signal RGBLB'. An output terminal of inverter I1 is coupled to an input terminal of delay circuit 410 and a first input terminal of feedback circuit 416, and is configured to output the signal RGBL'.

Delay circuit 410 is coupled between inverter I1 and inverter I2. Delay circuit 410 is configured to generate a delayed signal S1 in response to the signal RGBL'. In some embodiments, the delayed signal S1 is delayed from the signal RGBL'. An input terminal of delay circuit 410 is configured to receive the signal RGBL'. An output terminal of delay circuit 410 is coupled to an input terminal of inverter I2 by a conductive path 412. The output terminal of delay circuit 410 is coupled to an input terminal of inverter I2, and is configured to output the signal RGBL'. In some embodiments, the conductive path 412 is a conductive wire loop that introduces a delay to delayed signal S1. In some embodiments, the delay circuit 410 is replaced with conductive path 412, and similar detailed description is therefore omitted.

Other configurations of delay circuit 410 are within the scope of the present disclosure.

Inverter I2 is configured to generate a signal S2 in response to the delayed signal S1. In some embodiments, the signal S2 is inverted from the delayed signal S1. The input terminal of inverter I2 is configured to receive the delayed signal S1. An output terminal of inverter I2 is coupled to a second input terminal of feedback circuit 416, and is configured to output the signal S2. In some embodiments, the signal S2 corresponds to a delayed version of the read global bit line bar signal RGBLB'.

Feedback circuit 416 is coupled between inverter I2 and the read global bit line bar RGBLB. Feedback circuit 416 is configured to adjust the rising edge or the falling edge of the read global bit line bar signal RGBLB' in response to the signal S2 and a transition of the signal RGBL'. In some embodiments, feedback circuit 416 is configured to adjust the rising edge or the falling edge of the read global bit line bar signal RGBLB' in response to the signal S2 and the transition of the corresponding read global bit line bar signal RGBLB'.

Feedback circuit 416 includes PMOS transistors MP1 and MP2, and NMOS transistors MN1 and MN2. A gate of NMOS transistor MN2 and a gate of PMOS transistor MP2 correspond to the first input terminal of feedback circuit 416. A gate of NMOS transistor MN1 and a gate of PMOS transistor MP1 correspond to the second input terminal of feedback circuit 416.

A source of PMOS transistor MP1 is coupled to a voltage supply VDD. A gate of PMOS transistor MP1 is configured to receive the signal S2, and is coupled to the output terminal of inverter I2 and a gate of NMOS transistor MN1. Each of a drain of PMOS transistor MP1 and a source of PMOS transistor MP2 are coupled together by least a node (not labelled).

A gate of PMOS transistor MP2 is configured to receive the signal RGBL', and is coupled to the output terminal of inverter I1 and a gate of NMOS transistor MN2. A drain of PMOS transistor MP2 and a drain of NMOS transistor MN2 are coupled together by an output node (not labelled), and the output node (not labelled) is further coupled to the read global bit line bar RGBLB. Thus, the drain of PMOS transistor MP2 and the drain of NMOS transistor MN2 are coupled to the read global bit line bar RGBLB.

A gate of NMOS transistor MN2 is configured to receive the signal RGBL', and is coupled to the output terminal of inverter I1 and the gate of PMOS transistor MP2. Each of a source of NMOS transistor MN2 and a drain of NMOS transistor MN1 are coupled together by least a node (not labelled).

A gate of NMOS transistor MN1 is configured to receive the signal S2, and is coupled to the output terminal of inverter I2 and the gate of PMOS transistor MP1. A source of NMOS transistor MN1 is coupled to a reference voltage supply VSS.

Other configurations, numbers of transistor or types of transistors in feedback circuit 416 are within the scope of the present disclosure.

Sense amplifier 420 is coupled to the driver circuit 430 and inverter I3. In some embodiments, sense amplifier 420 is further coupled to one or more memory cells in memory cell array 210*a* or 210*b*. Sense amplifier 420 is configured to sense a bit line bar signal RBLB and a bit line signal RBL in response to at least a sense amplifier signal SAE. In some embodiments, bit line bar signal RBLB is a local bit line bar signal, and bit line signal RBL is a local bit line signal. In some embodiments, the bit line bar signal RBLB corresponds to a value of data stored in one or more memory cells in memory cell array 210*a* or 210*b*.

Inverter I3 is coupled to the sense amplifier 420 and the driver circuit 430. Inverter I3 is configured to generate an inverted bit line signal RBLN in response to the bit line signal RBL. In some embodiments, the inverted bit line signal RBLN is inverted from the bit line signal RBL. An input terminal of inverter I3 is coupled to the sense amplifier 420 by a local bit line. The input terminal of inverter I3 is configured to receive the bit line signal RBL from the sense amplifier 420. An output terminal of inverter I3 is coupled to a gate of NMOS transistor MN3 of driver circuit 430, and is configured to output the inverted bit line signal RBLN. In some embodiments, the inverted bit line signal RBLN corresponds to the bit line bar signal RBLB. In some embodiments, the inverted bit line signal RBLN corresponds to the value of data stored in one or more memory cells in memory cell array 210*a* or 210*b*.

Driver circuit 430 is coupled to the read global bit line bar GBLB, sense amplifier 420 and inverter I3. Driver circuit 430 is configured to adjust the read global bit line bar signal RGBLB' in response to at least the inverted bit line signal RBLN or the bit line bar signal RBLB. In some embodiments, driver circuit 430 is configured to cause a transition of the read global bit line bar signal RGBLB' to a logic 1 or a logic 0 based on a value of datum stored in a memory cell (not shown) coupled to the sense amplifier. In some embodiments, driver circuit 430 is configured to cause a transition of the read global bit line bar signal RGBLB' to a logic 1 or a logic 0 in response to at least the inverted bit line signal RBLN or the bit line bar signal RBLB.

Driver circuit 430 includes PMOS transistor MP3 and NMOS transistor MN3.

A source of PMOS transistor MP3 is coupled to the voltage supply VDD. A gate of PMOS transistor MP3 is configured to receive the bit line bar signal RBLB, and is coupled to the sense amplifier 420 by a local bit line bar. Each of a drain of PMOS transistor MP3 and a drain of NMOS transistor MN3 are coupled together by least an output node (not labelled). Each of the drain of PMOS transistor MP3 and the drain of NMOS transistor MN3 are coupled to the read global bit line bar RGBLB.

A gate of NMOS transistor MN3 is configured to receive the inverted bit line signal RBLN, and is coupled to the output terminal of inverter I3. A source of NMOS transistor MN3 is coupled to the reference voltage supply VSS.

While FIGS. 4-7 are described with the conductive line 260 as the read global bit line bar RGBLB, in some embodiments, the conductive line 260 is a read global bit line RGBL, and similar detailed description is therefore omitted. In these embodiments, the local bit line and the local bit line bar would be swapped with each other, as well as the bit line signal RBL of the local bit line and the bit line bar signal RBLB of the local bit line bar.

Other configurations, numbers of transistor or types of transistors in driver circuit 430 are within the scope of the present disclosure.

Other configurations, other circuit elements, numbers of transistor or types of transistors in LIO circuit 402 are within the scope of the present disclosure.

GIO circuit 404 is coupled to the read global bit line bar RGBLB and the LIO circuit 402. GIO circuit 404 is configured to output a data signal Q in response to the read global bit line bar signal RGBLB. In some embodiments, the data signal Q corresponds to the value of data stored in one or more memory cells in memory cell array 210*a* or 210*b*.

GIO circuit 404 includes an inverter I6 and a latch circuit 408.

Inverter I6 is configured to generate the data signal Q in response to the read global bit line bar signal RGBLB'. In some embodiments, the data signal Q is inverted from the read global bit line bar signal RGBLB'. An input terminal of inverter I6 is coupled to the read global bit line bar RGBLB, and is configured to receive the read global bit line bar signal RGBLB'. An output terminal of inverter I6 is configured to output the data signal Q. In some embodiments, the data signal Q corresponds to the bit line bar signal RBLB.

Latch circuit 408 is coupled to the read global bit line bar RGBLB and the input terminal of inverter I6. Latch circuit 408 is configured to latch a state or the value of the read global bit line bar signal RGBLB'. In some embodiments, latch circuit 408 is enabled or disabled by an enable signal RGBLEN and an inverted enable signal RGBLENB. In some embodiments, latch circuit 408 is disabled immediately prior to driver circuit 430 beginning to drive the read global bit line bar RGBLB. In some embodiments, latch circuit 408 is enabled after driver circuit 430 drives the read global bit line bar RGBLB.

Latch circuit 408 includes an inverter I4 and an inverter I5.

Inverter I4 is configured to generate a signal S3 in response to the read global bit line bar signal RGBLB'. In some embodiments, the signal S3 is inverted from the read global bit line bar signal RGBLB'. An input terminal of inverter I4 is coupled to the read global bit line bar RGBLB, and is configured to receive the read global bit line bar signal RGBLB'. An output terminal of inverter I4 is coupled to an input terminal of inverter I5, and is configured to output the signal S3.

Inverter I5 is configured to generate the read global bit line bar signal RGBLB' in response to signal S3. A first input terminal of inverter I5 is coupled to the output terminal of inverter I4, and is configured to receive the signal S3. A second input terminal of inverter I5 is configured to receive the enable signal RGBLEN. A third input terminal of inverter I5 is configured to receive the inverted enable signal RGBLENB. An output terminal of inverter I5 is coupled to the input terminal of inverter I6, and is configured to output the read global bit line bar signal RGBLB'.

In some embodiments, inverter I5 is enabled or disabled by the enable signal RGBLEN and the inverted enable signal RGBLENB. In some embodiments, inverter I5 is disabled immediately prior to driver circuit 430 beginning to drive the read global bit line bar RGBLB. In some embodiments, inverter I5 is enabled after driver circuit 430 drives the read global bit line bar RGBLB. In some embodiments, inverter I5 is disabled during read operations of memory cells. In some embodiments, inverter I5 is enabled before or after read operations of memory cells.

Other configurations, other types of circuit elements or numbers of circuit elements in GIO circuit 404 are within the scope of the present disclosure.

A non-limiting example of a read operation of a memory cell coupled to the LIO circuit 402 is described with respect to driver circuit 430, sense amplifier 420 and inverter I3, and GIO circuit 404. For brevity, operation of at least booster circuit 406 is described below with respect to FIG. 5.

For example, in some embodiments, if the memory cell coupled to LIO circuit 402 is configured to store a logic 1, and a difference between a voltage of the bit line bar signal RBLB and the bit line signal RBL is greater than 0 (e.g., V(RBLB)−V(RBL)>0), then when the sense amplifier 420 turns on in response to the sense amplifier signal SAE, the bit line signal RBL becomes a logic 0, and the bit line bar signal RBLB stays a logic 1. In response to the bit line signal RBL becoming a logic 0, the inverter I3 causes signal RBLN to be a logic 1 thereby turning on NMOS transistor N3. In response to turning on NMOS transistor N3, NMOS transistor N3 pulls the read global bit line bar RGBLB and the read global bit line bar signal RGBLB' towards the reference voltage supply VSS, and is a logic 0. In response to the read global bit line bar signal RGBLB' being a logic 0, the inverter I6 causes the output signal Q to be a logic 1 which corresponds to the data stored in the memory cell coupled to the LIO circuit 402.

For example, in some embodiments, if the memory cell coupled to LIO circuit 402 is configured to store a logic 0, and a difference between a voltage of the bit line signal RBL and the bit line bar signal RBLB is greater than 0 (e.g., V(RBL)−V(RBLB)>0), then when the sense amplifier 420 turns on in response to the sense amplifier signal SAE, the bit line signal RBL becomes a logic 1, and the bit line bar signal RBLB becomes a logic 0. In response to the bit line signal RBL becoming a logic 1, the inverter I3 causes signal RBLN to be a logic 0 thereby turning off NMOS transistor N3. In response to the bit line bar signal RBLB becoming a logic 0, causes PMOS transistor P3 to turn on. In response to turning on PMOS transistor P3, PMOS transistor P3 pulls the read global bit line bar RGBLB and the read global bit line bar signal RGBLB' towards the voltage supply VDD, and is a logic 1. In response to the read global bit line bar signal RGBLB' being a logic 1, the inverter I6 causes the output signal Q to be a logic 0 which corresponds to the data stored in the memory cell coupled to the LIO circuit 402.

In some embodiments, memory circuit 400 operates to achieve one or more benefits described herein including the details discussed above with respect to memory circuit 100 or 200.

Other configurations of memory circuit 400 are within the scope of the present disclosure.

Waveforms

Figure 5:
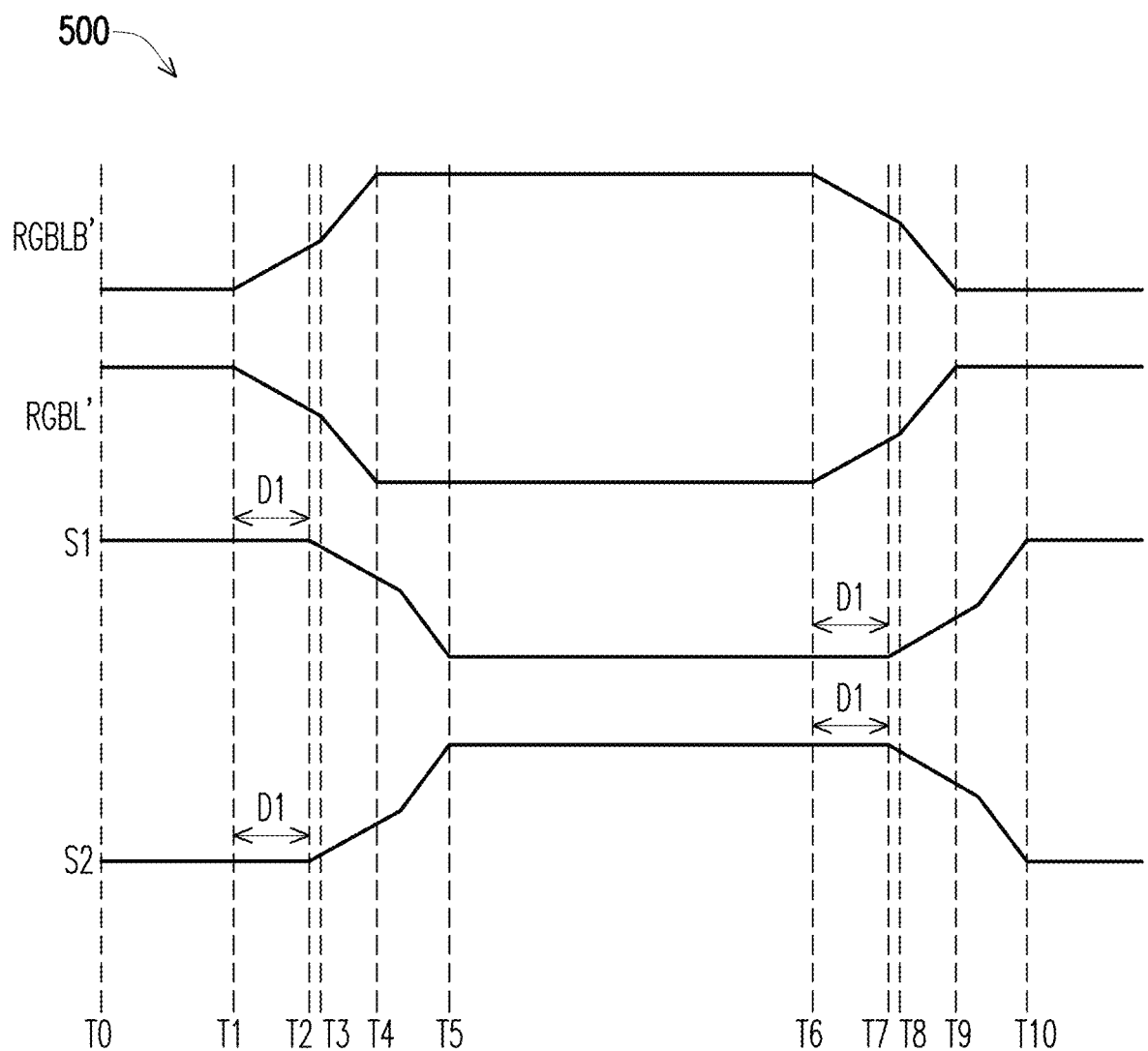
FIG. 5 is a timing diagram of waveforms of a memory circuit, such as the memory circuit in FIG. 4, the memory circuit in FIG. 6, the memory circuit in FIG. 7 or the memory circuit in FIG. 8A or 8B, in accordance with some embodiments.
Figure 6:
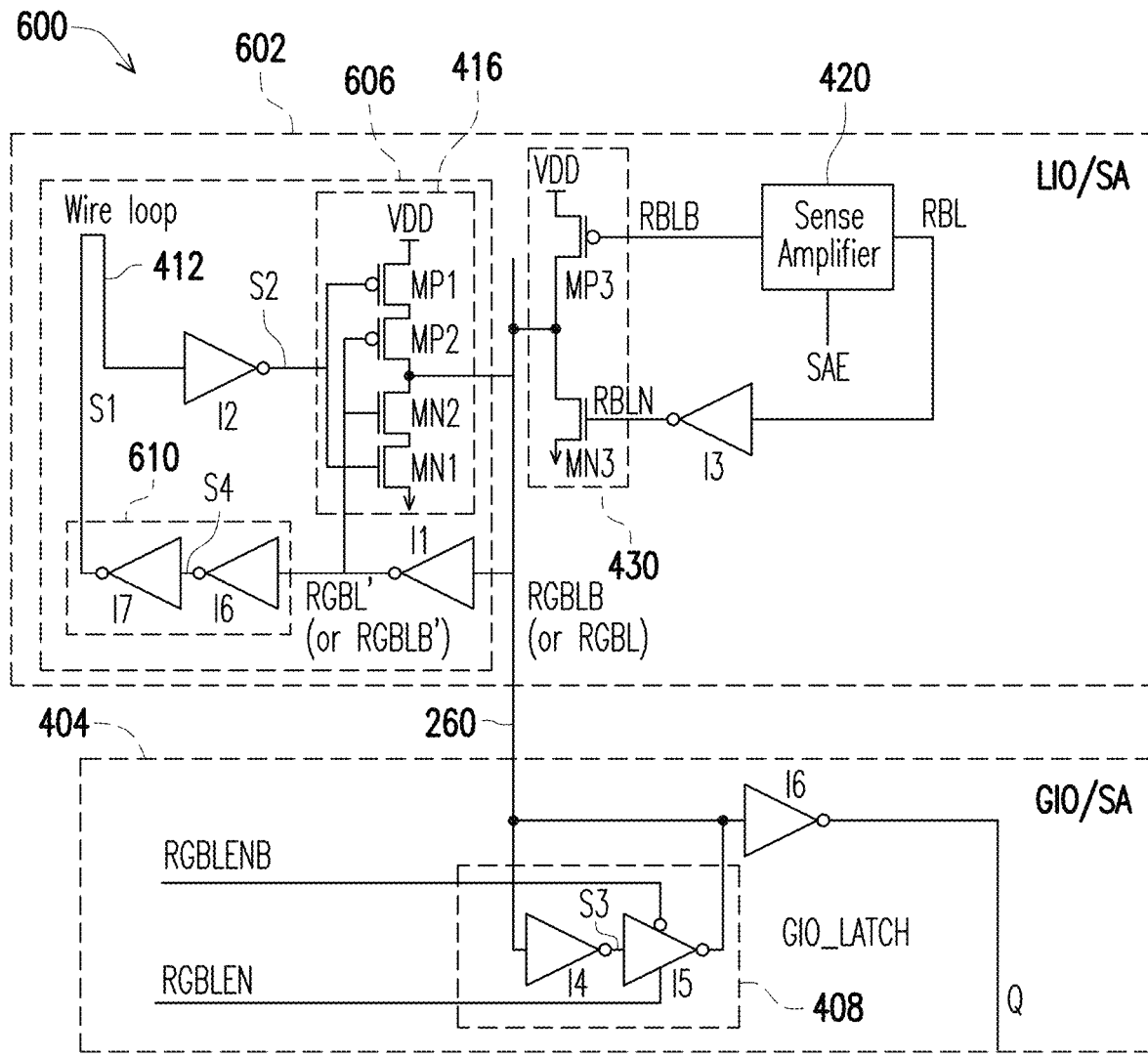
FIG. 6 is a circuit diagram of a memory circuit, in accordance with some embodiments.
Figure 7:
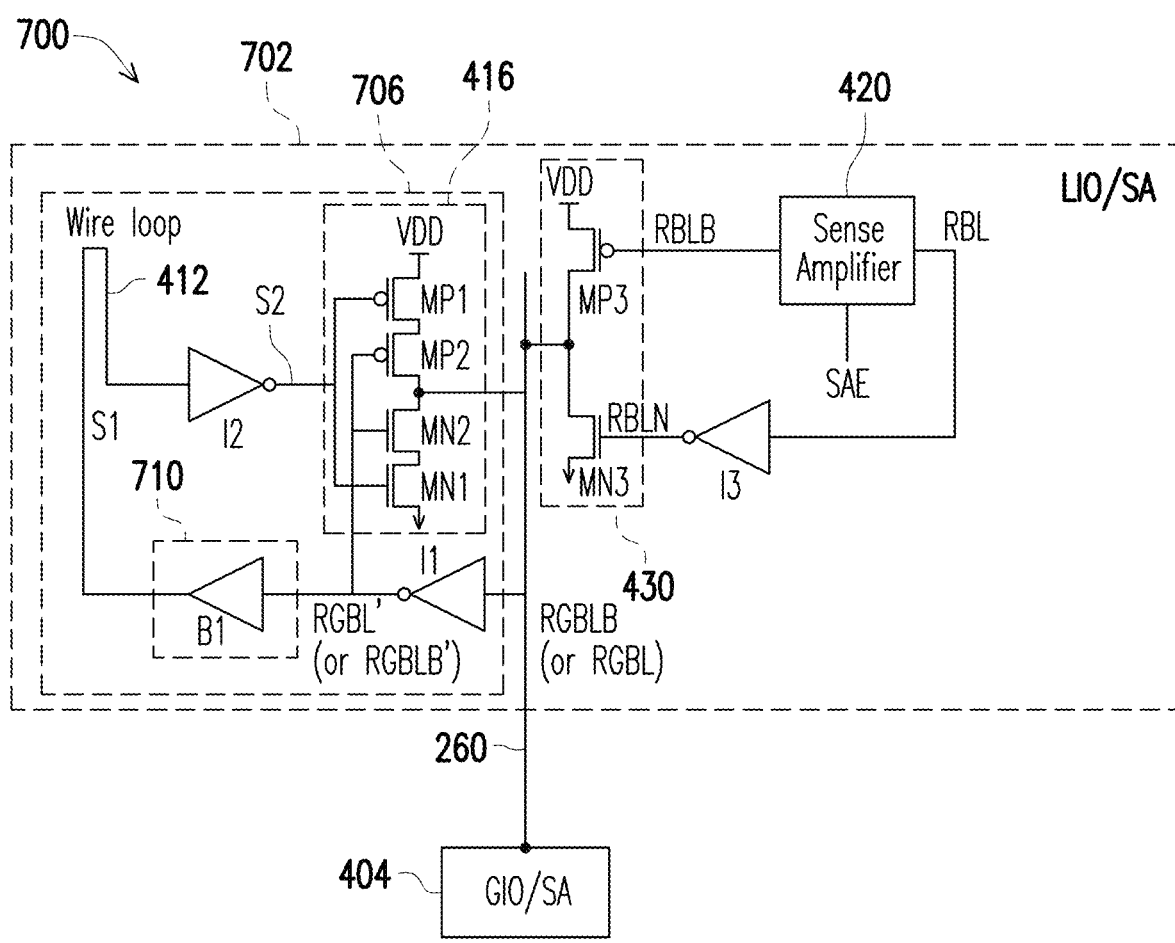
FIG. 7 is a circuit diagram of a memory circuit, in accordance with some embodiments.
Figure 8A:
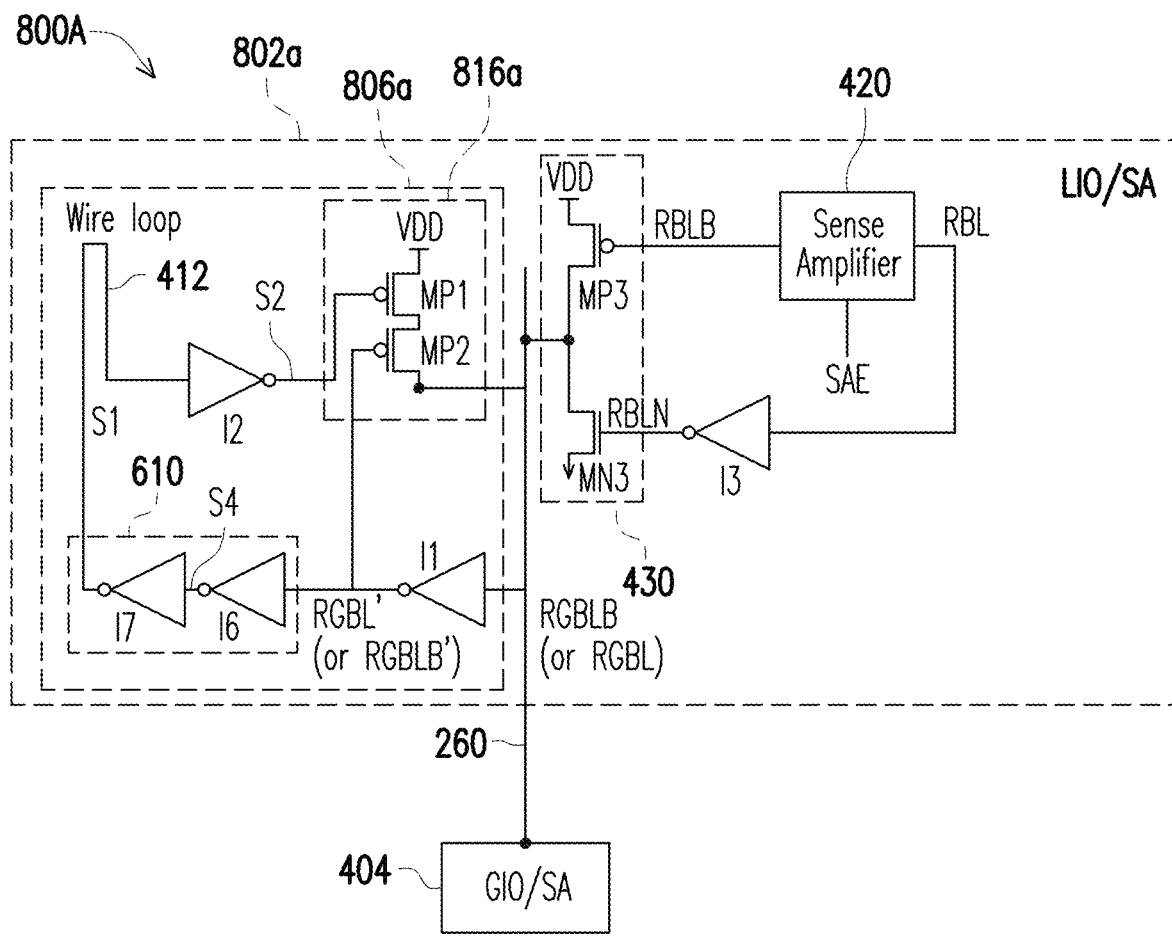
FIGS. 8A-8B are corresponding circuit diagrams of corresponding memory circuits, in accordance with some embodiments.
Figure 8B:
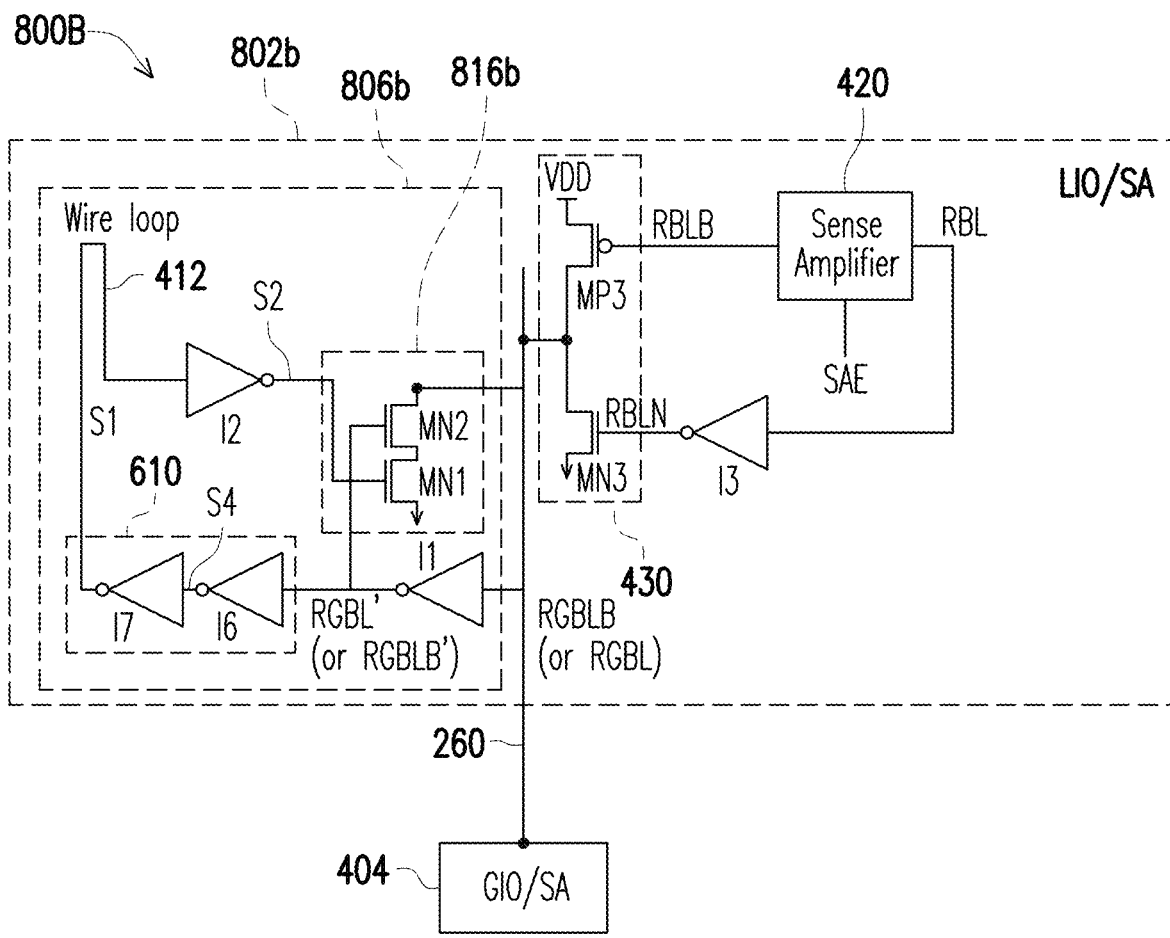

FIG. 5 is a timing diagram 500 of waveforms of a memory circuit, such as memory circuit 400 in FIG. 4, memory circuit 600 in FIG. 6, memory circuit 700 in FIG. 7 or memory circuits 800A-800B in FIGS. 8A-8B, in accordance with some embodiments.

In some embodiments, FIG. 5 is a timing diagram 500 of at least memory circuit 100-200, memory circuit 400 or memory circuit 600-900 of FIGS. 6-9, in accordance with some embodiments.

Figure 9:
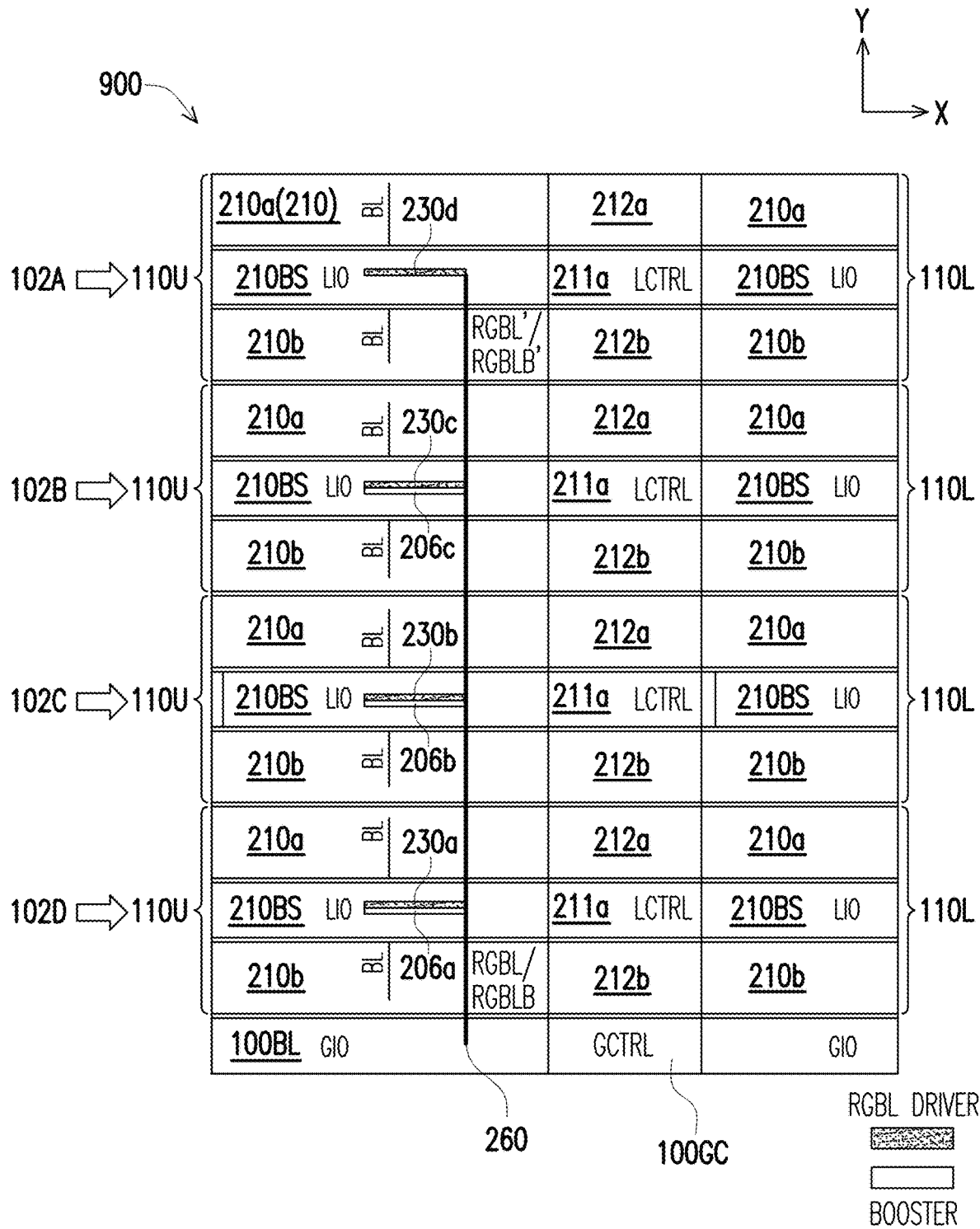
FIG. 9 is a circuit diagram of a memory circuit, in accordance with some embodiments.

In some embodiments, one or more read operations of the memory banks in at least memory circuit 200 or 900 of FIG. 9 are applied to at least one of memory partition 102A, 102B, 102C or 102D, and timing diagram 500 corresponds to waveforms during the read operations of at least one of memory partition 102A, 102B, 102C or 102D.

Timing diagram 500 includes waveforms of the read global bit line bar signal RGBLB', the read global bit line signal RGBL', the signal S1 and the signal S2.

At time T0, the read global bit line bar signal RGBLB' is logically low, the read global bit line signal RGBL' is logically high, the signal S1 is logically high and the signal S2 is logically low.

At time T0, in response to the read global bit line signal RGBL' being logically high, and in response to the signal S2 being logically low, the feedback circuit 416 is turned off. For example, at time TO, in response to the read global bit line signal RGBL' being logically high, the NMOS transistor MN2 is turned on, and PMOS transistor MP2 is turned off, and in response to the signal S2 being logically low, the NMOS transistor MN1 is turned off, and PMOS transistor MP1 is turned on.

At time T1, the driver circuit 430 causes the read global bit line bar signal RGBLB' to transition from logically low to logically high, and inverter I1 causes the read global bit line signal RGBL' to transition from logically high to logically low.

At time T2, the delay circuit 410 causes the signal S1 to transition from logically high to logically low, and inverter I2 causes the signal S2 to transition from logically low to logically high.

In some embodiments, the signal S1 is delayed with respect to the read global bit line signal RGBL' by at least a delay D1. In some embodiments, the delay D1 is caused by the delay circuit 410. In some embodiments, the signal S2 is delayed with respect to the read global bit line bar signal RGBLB' by at least the delay D1.

At time T3, the transition of the read global bit line signal RGBL' to logically low is sufficient enough to cause the feedback circuit 416 to turn on. For example, in some embodiments, at time T3, the transition of the read global bit line signal RGBL' to logically low is sufficient enough to cause PMOS transistor MP2 to turn on, and NMOS transistor MN2 to turn off.

At time T3, since the signal S2 is delayed with respect to the transition of the read global bit line bar signal RGBLB' by delay D1, the signal S2 at time T3 causes PMOS transistor MP1 to remain turned on, and NMOS transistor MN1 to remain turned off.

At time T3, in response to the feedback circuit 416 turning on, the read global bit line bar signal RGBLB' is boosted, and therefore transitions toward logically high faster than before time T3. For example, at time T3, in response to PMOS transistor MP2 turning on and PMOS transistor MP1 being already turned on, the feedback circuit 416 turns on, thereby causing the output node of the feedback circuit 416 to be electrically coupled to the voltage supply VDD, and PMOS transistors MP1 and MP2 pull the output node and the read global bit line bar signal RGBLB' towards supply voltage VDD.

At time T4, the read global bit line bar signal RGBLB' is logically high, and the read global bit line signal RGBL' is logically low.

Between time T4 and T5, the transition of signal S2 to logically high is sufficient enough to cause PMOS transistor MP1 to turn off, and NMOS transistor MN1 to turn on, and the feedback circuit 416 is turned off, and the read global bit line bar signal RGBLB' is no longer boosted by feedback circuit 416. In some embodiments, the read global bit line bar signal RGBLB' is boosted until the delay D1 has passed. For example, in some embodiments, PMOS transistors MP1 and MP2 pull the output node and the read global bit line bar signal RGBLB' towards supply voltage VDD until the transition of signal S2 to logically high is sufficient enough to cause PMOS transistor MP1 to turn off, and NMOS transistor MN1 to turn on (e.g., between time T4 and T5).

At time T5, the read global bit line bar signal RGBLB' is logically high, the read global bit line signal RGBL' is logically low, the signal S1 is logically low and the signal S2 is logically high. For example, at time T5, in response to the read global bit line signal RGBL' being logically low, the NMOS transistor MN2 is turned off, and PMOS transistor MP2 is turned on, and in response to the signal S2 being logically high, the NMOS transistor MN1 is turned on, and PMOS transistor MP1 is turned off.

At time T6, the driver circuit 430 causes the read global bit line bar signal RGBLB' to transition from logically high to logically low, and inverter I1 causes the read global bit line signal RGBL' to transition from logically low to logically high.

At time T7, the delay circuit 410 causes the signal S1 to transition from logically low to logically high, and inverter I2 causes the signal S2 to transition from logically high to logically low.

In some embodiments, the signal S1 is delayed with respect to the read global bit line signal RGBL' by at least the delay D1.

At time T8, the transition of the read global bit line signal RGBL' to logically high is sufficient enough to cause the feedback circuit 416 to turn on. For example, in some embodiments, at time T8, the transition of the read global bit line signal RGBL' to logically high is sufficient enough to cause PMOS transistor MP2 to turn off, and NMOS transistor MN2 to turn on.

At time T8, since the signal S2 is delayed with respect to the transition of the read global bit line bar signal RGBLB' by delay D1, the signal S2 at time T8 causes PMOS transistor MP1 to remain turned off, and NMOS transistor MN1 to remain turned on.

At time T8, in response to the feedback circuit 416 turning on, the read global bit line bar signal RGBLB' is boosted, and therefore transitions toward logically low faster than before time T8. For example, at time T8, in response to NMOS transistor MN2 turning on and NMOS transistor MN1 being already turned on, the feedback circuit 416 turns on, thereby causing the output node of the feedback circuit 416 to be electrically coupled to the reference voltage supply VSS, and NMOS transistors MN1 and MN2 pull the output node and the read global bit line bar signal RGBLB' towards the reference voltage supply VSS.

At time T9, the read global bit line bar signal RGBLB' is logically low, and the read global bit line signal RGBL' is logically high.

Between time T9 and T10, the transition of signal S2 to logically low is sufficient enough to cause PMOS transistor MP1 to turn on, and NMOS transistor MN1 to turn off, and the feedback circuit 416 is turned off, and the read global bit line bar signal RGBLB' is no longer boosted by feedback circuit 416. In some embodiments, the read global bit line bar signal RGBLB' is boosted until the delay D1 has passed. For example, in some embodiments, NMOS transistors MN1 and MN2 pull the output node and the read global bit line bar signal RGBLB' towards the reference voltage supply VSS until the transition of signal S2 to logically low is sufficient enough to cause PMOS transistor MP1 to turn on, and NMOS transistor MN1 to turn off (e.g., between time T9 and T10).

At time T10, the read global bit line bar signal RGBLB' is logically low, the read global bit line signal RGBL' is logically high, the signal S1 is logically high and the signal S2 is logically low. For example, at time T10, in response to the read global bit line signal RGBL' being logically high, the NMOS transistor MN2 is turned on, and PMOS transistor MP2 is turned off, and in response to the signal S2 being logically low, the NMOS transistor MN1 is turned off, and PMOS transistor MP1 is turned on.

As shown between at least times T3 and T4, booster circuit 406 causes the read global bit line bar signal RGBLB' to transition from logically low to logically high faster than approaches without booster circuit 406, thereby resulting in faster read operations than other approaches without booster circuit 406.

As shown between at least times T8 and T9, booster circuit 406 causes the read global bit line bar signal RGBLB' to transition from logically high to logically low faster than approaches without booster circuit 406, thereby resulting in faster read operations than other approaches without booster circuit 406.

In some embodiments, while timing diagram 500 is described with respect to memory banks 110U, timing diagram 500 is also applicable to memory banks 110L in a similar manner, and is not described for brevity.

Other configurations of timing diagram 500 are within the scope of the present disclosure.

FIG. 6 is a circuit diagram of a memory circuit 600, in accordance with some embodiments.

Memory circuit 600 is an embodiment of LIO circuit 210BS and GIO circuit 100BL of FIG. 2, and similar detailed description is therefore omitted. For example, memory circuit 600 illustrates a non-limiting example where a delay circuit 610 includes a pair of inverters (e.g., inverter I6 and inverter I7), and similar detailed description is therefore omitted.

Memory circuit 600 includes an LIO circuit 602 coupled to GIO circuit 404 by conductive line 260. Memory circuit 600 is a variation of memory circuit 400 of FIG. 4, and similar detailed description is therefore omitted. In comparison with memory circuit 400 of FIG. 4, LIO circuit 602 of FIG. 6 replaces LIO circuit 402, and similar detailed description is therefore omitted.

LIO circuit 602 includes a booster circuit 606, sense amplifier 420, inverter I3, and driver circuit 430.

Booster circuit 606 is a variation of booster circuit 406. For example, booster circuit 606 replaces booster circuit 406, and similar detailed description is therefore omitted. Booster circuit 606 includes inverter I1, a delay circuit 610, inverter I2 and feedback circuit 416.

Delay circuit 610 of booster circuit 606 of FIG. 6 is an embodiment of delay circuit 410, and similar detailed description is therefore omitted.

Delay circuit 610 includes an inverter I6 and an inverter I7.

Inverter I6 is configured to generate a signal S4 in response to the signal RGBL'. In some embodiments, the signal S4 is inverted from the signal RGBL'. An input terminal of inverter I6 is coupled to the output terminal of inverter I1, and is configured to receive the signal RGBL'. An output terminal of inverter I6 is coupled to an input terminal of inverter I7, and is configured to output the signal S4.

Inverter I7 is configured to generate the signal S1 in response to the signal S4. In some embodiments, the signal S4 is inverted from the signal S1. An input terminal of inverter I7 is coupled to the output terminal of inverter I6, and is configured to receive the signal S4. An output terminal of inverter I7 is coupled to the input terminal of inverter I2, and is configured to output the signal S1.

Other configurations, other circuit elements, numbers of inverters, numbers of transistor or types of transistors in LIO circuit 602 are within the scope of the present disclosure.

In some embodiments, memory circuit 600 operates to achieve one or more benefits described herein including the details discussed above with respect to memory circuit 100, 200 or 400.

Other configurations of memory circuit 600 are within the scope of the present disclosure.

FIG. 7 is a circuit diagram of a memory circuit 700, in accordance with some embodiments.

Memory circuit 700 is an embodiment of LIO circuit 210BS and GIO circuit 100BL of FIG. 2, and similar detailed description is therefore omitted. For example, memory circuit 700 illustrates a non-limiting example where a delay circuit 710 includes a buffer circuit B1, and similar detailed description is therefore omitted.

Memory circuit 700 includes an LIO circuit 702 coupled to GIO circuit 404 by conductive line 260. Memory circuit 700 is a variation of memory circuit 400 of FIG. 4, and similar detailed description is therefore omitted. In comparison with memory circuit 400 of FIG. 4, LIO circuit 702 of FIG. 7 replaces LIO circuit 402, and similar detailed description is therefore omitted.

LIO circuit 702 includes a booster circuit 706, sense amplifier 420, inverter I3, and driver circuit 430.

Booster circuit 706 is a variation of booster circuit 406. For example, booster circuit 706 replaces booster circuit 406, and similar detailed description is therefore omitted. Booster circuit 706 includes inverter I1, a delay circuit 710, inverter I2 and feedback circuit 416.

Delay circuit 710 of booster circuit 706 of FIG. 7 is an embodiment of delay circuit 410, and similar detailed description is therefore omitted.

Delay circuit 710 includes a buffer circuit B1.

Buffer circuit B1 is configured to generate the delayed signal S1 in response to the signal RGBL'. An input terminal of buffer circuit B1 is coupled to the output terminal of inverter I1, and is configured to receive the signal RGBL'. An output terminal of buffer circuit B1 is coupled to the input terminal of inverter I2, and is configured to output the delayed signal S1.

Other configurations, other circuit elements, numbers of buffer circuits, numbers of transistor or types of transistors in LIO circuit 702 are within the scope of the present disclosure.

In some embodiments, memory circuit 700 operates to achieve one or more benefits described herein including the details discussed above with respect to memory circuit 100, 200 or 400.

Other configurations of memory circuit 700 are within the scope of the present disclosure.

FIGS. 8A-8B are corresponding circuit diagrams of corresponding memory circuits 800A-800B, in accordance with some embodiments.

Memory circuits 800A-800B are a variation of memory circuit 600 of FIG. 6, and similar detailed description is therefore omitted. For example, memory circuit 800A illustrates a non-limiting example where a feedback circuit 816a does not include NMOS transistors MN1 and MN2, and memory circuit 800B illustrates a non-limiting example where a feedback circuit 816b does not include PMOS transistors MP1 and MP2, and similar detailed description is therefore omitted.

Memory circuits 800A-800B are embodiments of LIO circuit 210BS and GIO circuit 100BL of FIG. 2, and similar detailed description is therefore omitted.

Memory circuit 800A includes an LIO circuit 802a coupled to GIO circuit 404 by conductive line 260. Memory circuit 800B includes an LIO circuit 802b coupled to GIO circuit 404 by conductive line 260. Memory circuits 800A-800B are variations of memory circuit 600 of FIG. 6, and similar detailed description is therefore omitted. In comparison with memory circuit 600 of FIG. 6, LIO circuit 802a of FIG. 8A replaces LIO circuit 602, and LIO circuit 802b of FIG. 8B replaces LIO circuit 602, and similar detailed description is therefore omitted.

LIO circuit 802a includes a booster circuit 806a, sense amplifier 420, inverter I3, and driver circuit 430. LIO circuit 802b includes a booster circuit 806b, sense amplifier 420, inverter I3, and driver circuit 430.

Booster circuits 806a-806b are variations of booster circuit 606. For example, booster circuits 806a and 806b replace booster circuit 606, and similar detailed description is therefore omitted. Booster circuit 806a includes inverter I1, delay circuit 710, inverter I2 and a feedback circuit 816a. Booster circuit 806b includes inverter I1, delay circuit 710, inverter I2 and a feedback circuit 816b.

In comparison with FIG. 6, feedback circuit 816a of FIG. 8A and feedback circuit 816b of FIG. 8B replace feedback circuit 616, and similar detailed description is therefore omitted.

Feedback circuit 816a includes PMOS transistors MP1 and MP2.

In comparison with feedback circuit 416, feedback circuit 816a does not include NMOS transistors MN1 and MN2. By not including NMOS transistors MN1 and MN2, memory circuit 800A includes less number of transistors, and therefore occupies less area than other approaches.

Feedback circuit 816b includes NMOS transistors MN1 and MN2.

In comparison with feedback circuit 416, feedback circuit 816b does not include PMOS transistors MP1 and MP2. By not including PMOS transistors MP1 and MP2, memory circuit 800B includes less number of transistors, and therefore occupies less area than other approaches.

Other configurations, numbers of transistor or types of transistors in feedback circuits 816a-816b are within the scope of the present disclosure.

Other configurations, other circuit elements, numbers of inverters, numbers of transistor or types of transistors in LIO circuit 802a or 802b are within the scope of the present disclosure.

In some embodiments, memory circuits 800A-800B operate to achieve one or more benefits described herein including the details discussed above with respect to memory circuit 100, 200 or 400.

Other configurations of memory circuits 800A-800B are within the scope of the present disclosure.

FIG. 9 is a circuit diagram of a memory circuit 900, in accordance with some embodiments.

Memory circuit 900 is a variation of memory circuit 200 of FIG. 2, and similar detailed description is therefore omitted. For example, memory circuit 900 illustrates a non-limiting example where at least one of the LIO circuits (e.g., LIO circuit 210BS) does not include a booster circuit, and similar detailed description is therefore omitted.

Memory circuit 900 includes memory partitions 102A-102D, global control circuit 100GC, GIO circuits 100BL and conductive line 260.

Memory circuit 900 is a variation of memory circuit 200 of FIG. 2, and similar detailed description is therefore omitted. In comparison with memory circuit 200 of FIG. 2, LIO circuit 210BS in memory partition 102A does not include booster circuit 206d.

LIO circuit 210BS in memory partition 102A includes RGBL driver circuit 230d.

The memory banks 110U and 110L in memory partition 102D are located adjacent to the GIO circuit 100BL. The memory banks 110U and 110L in memory partition 102A are located adjacent to a first end or an edge of memory circuit 900 that is opposite from a second end of the memory circuit 900. The second end of memory circuit 900 is the end of memory circuit 900 where the GIO circuit 100BL is located.

Figure 10:
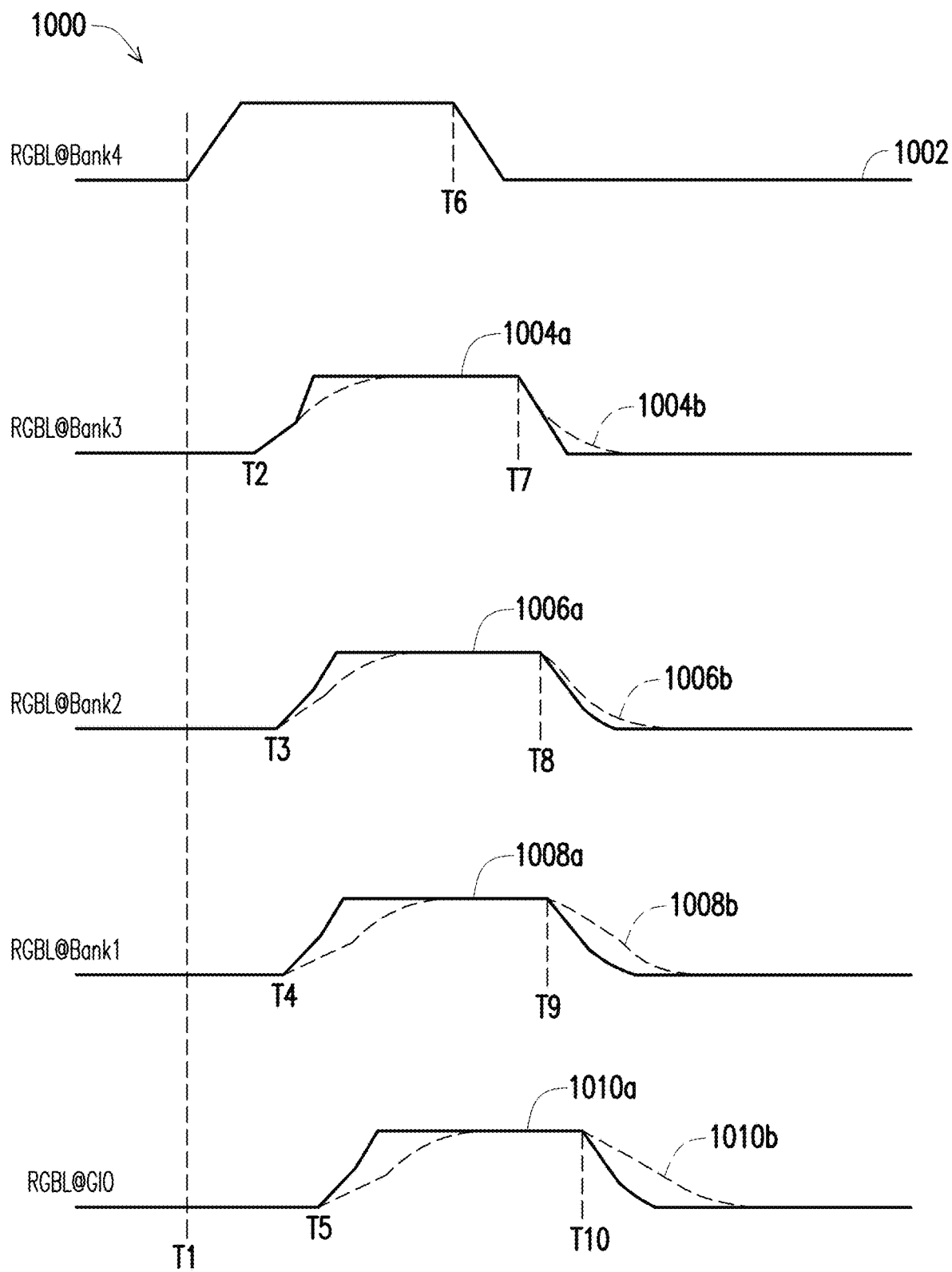
FIG. 10 is a timing diagram of waveforms of a memory circuit, such as the circuit in FIG. 2 or the circuit in FIG. 9, in accordance with some embodiments.

In some embodiments, one or more read operations of the memory banks in memory circuit 900 are applied in a sequential manner as shown in FIG. 10. For example, read operations are applied to memory banks 110U and 110L in memory partition 102A, then read operations are applied to memory banks 110U and 110L in memory partition 102B, then read operations are applied to memory banks 110U and 110L in memory partition 102C and then read operations are applied to memory banks 110U and 110L in memory partition 102D.

In some embodiments, since the read operations of memory banks 110U and 110L in memory partition 102A occur prior to the read operations of memory banks 110U and 110L in memory partitions 102B-102D, the read global bit line bar signal RGBLB' (e.g., shown as waveform 1002 in FIG. 10) is not corrupted from noise and resistive/capacitive loading, therefore the memory partition 102A in memory circuit 900 does not include booster circuit 206d.

Other configurations, other circuit elements, numbers of inverters, numbers of transistor or types of transistors in LIO circuit 802 are within the scope of the present disclosure.

In some embodiments, memory circuit 900 operates to achieve one or more benefits described herein including the details discussed above with respect to memory circuit 100, 200 or 400.

Other configurations of memory circuit 900 are within the scope of the present disclosure.

Waveforms

FIG. 10 is a timing diagram 1000 of waveforms of a memory circuit, such as circuit 200 in FIG. 2 or circuit 900 in FIG. 9, in accordance with some embodiments.

In some embodiments, FIG. 10 is a timing diagram 1000 of at least memory circuit 100-200, memory circuit 400 or memory circuit 600-900 of FIGS. 6-9, in accordance with some embodiments.

In some embodiments, one or more read operations of the memory banks in at least memory circuit 200 or 900 are applied to memory partition 102A, memory partition 102B, memory partition 102C and memory partition 102D in a sequential manner (e.g., time T1-time T5) as shown in FIG. 10, and waveforms 1002, 1004a, 1004b, 1006a, 1006b, 1008a, 1008b, 1010a and 1010b correspond to the waveforms during the sequential read operations of memory partition 102A, memory partition 102B, memory partition 102C and memory partition 102D.

Timing diagram 1000 includes waveforms 1002, 1004a, 1004b, 1006a, 1006b, 1008a, 1008b, 1010a and 1010b.

In some embodiments, waveform 1002 corresponds to the read global bit line RGBL during a read operation of memory bank 110U of memory partition 102A of FIG. 2 with booster circuit 206d. In some embodiments, waveform 1002 corresponds to the read global bit line RGBL during a read operation of memory bank 110U of memory partition 102B of FIG. 8A or 8B without booster circuit 206d.

In some embodiments, waveform 1004a corresponds to the read global bit line RGBL during a read operation of memory bank 110U of memory partition 102B with booster circuit 206c, and waveform 1004b corresponds to the read global bit line RGBL during a read operation of memory bank 110U of memory partition 102B without booster circuit 206c.

In some embodiments, waveform 1006a corresponds to the read global bit line RGBL during a read operation of memory bank 110U of memory partition 102C with booster circuit 206b, and waveform 1006b corresponds to the read global bit line RGBL during a read operation of memory bank 110U of memory partition 102C without booster circuit 206b.

In some embodiments, waveform 1008a corresponds to the read global bit line RGBL during a read operation of memory bank 110U of memory partition 102D with booster circuit 206a, and waveform 1008b corresponds to the read global bit line RGBL during a read operation of memory bank 110U of memory partition 102D without booster circuit 206a.

In some embodiments, waveform 1010a corresponds to waveform 1008a at the GIO circuit 100BL, and waveform 1010b corresponds to waveform 1008a at the GIO circuit 100BL.

In some embodiments, waveforms 1002, 1004a, 1004b, 1006a, 1006b, 1008a, 1008b, 1010a and 1010b correspond to a read "1" of the read global bit line RGBL. In some embodiments, waveforms 1002, 1004a, 1004b, 1006a, 1006b, 1008a, 1008b, 1010a and 1010b correspond to a read "0" of the read global bit line RGBL.

At time T1, waveform 1002 transitions from logically low to logically high, and since the read operations of memory bank 110U in memory partition 102A occur prior to the read operations of memory bank 110U in memory partitions 102B-102D, the read global bit line bar signal RGBLB' (e.g., shown as waveform 1002) is not corrupted from noise and resistive/capacitive loading. In some embodiments, since waveform 1002 is not corrupted from noise and resistive/capacitive loading, memory bank 110U in memory partition 102A can be configured without booster circuit 206d.

At time T2, waveforms 1004a and 1004b transition from logically low to logically high. In some embodiments, by including booster circuit 206c in memory bank 110U in memory partition 102B, waveform 1004a transitions from logically low to logically high faster than waveform 1004b, thereby resulting in faster read operations than approaches without booster circuit 206c.

At time T3, waveforms 1006a and 1006b transition from logically low to logically high. In some embodiments, by including booster circuit 206b in memory bank 110U in memory partition 102C, waveform 1006a transitions from logically low to logically high faster than waveform 1006b, thereby resulting in faster read operations than approaches without booster circuit 206b.

At time T4, waveforms 1008a and 1008b transition from logically low to logically high. In some embodiments, by including booster circuit 206a in memory bank 110U in memory partition 102D, waveform 1008a transitions from logically low to logically high faster than waveform 1008b, thereby resulting in faster read operations than approaches without booster circuit 206a.

At time T5, waveforms 1010a and 1010b transition from logically low to logically high.

At time T6, waveform 1002 transitions from logically high to logically low.

At time T7, waveforms 1004a and 1004b transition from logically high to logically low. In some embodiments, by including booster circuit 206c in memory bank 110U in memory partition 102B, waveform 1004a transitions from logically high to logically low faster than waveform 1004b, thereby resulting in faster read operations than approaches without booster circuit 206c.

At time T8, waveforms 1006a and 1006b transition from logically high to logically low. In some embodiments, by including booster circuit 206b in memory bank 110U in memory partition 102C, waveform 1006a transitions from logically high to logically low faster than waveform 1006b, thereby resulting in faster read operations than approaches without booster circuit 206b.

At time T9, waveforms 1008a and 1008b transition from logically high to logically low. In some embodiments, by including booster circuit 206a in memory bank 110U in memory partition 102D, waveform 1008a transitions from logically high to logically low faster than waveform 1008b, thereby resulting in faster read operations than approaches without booster circuit 206a.

At time T10, waveforms 1010a and 1010b transition from logically high to logically low.

In some embodiments, while timing diagram 1000 is described with respect to memory banks 110U, timing diagram 1000 is also applicable to memory banks 110L in a similar manner, and is not described for brevity.

Other configurations of timing diagram 1000 are within the scope of the present disclosure.

Method

Figure 11:
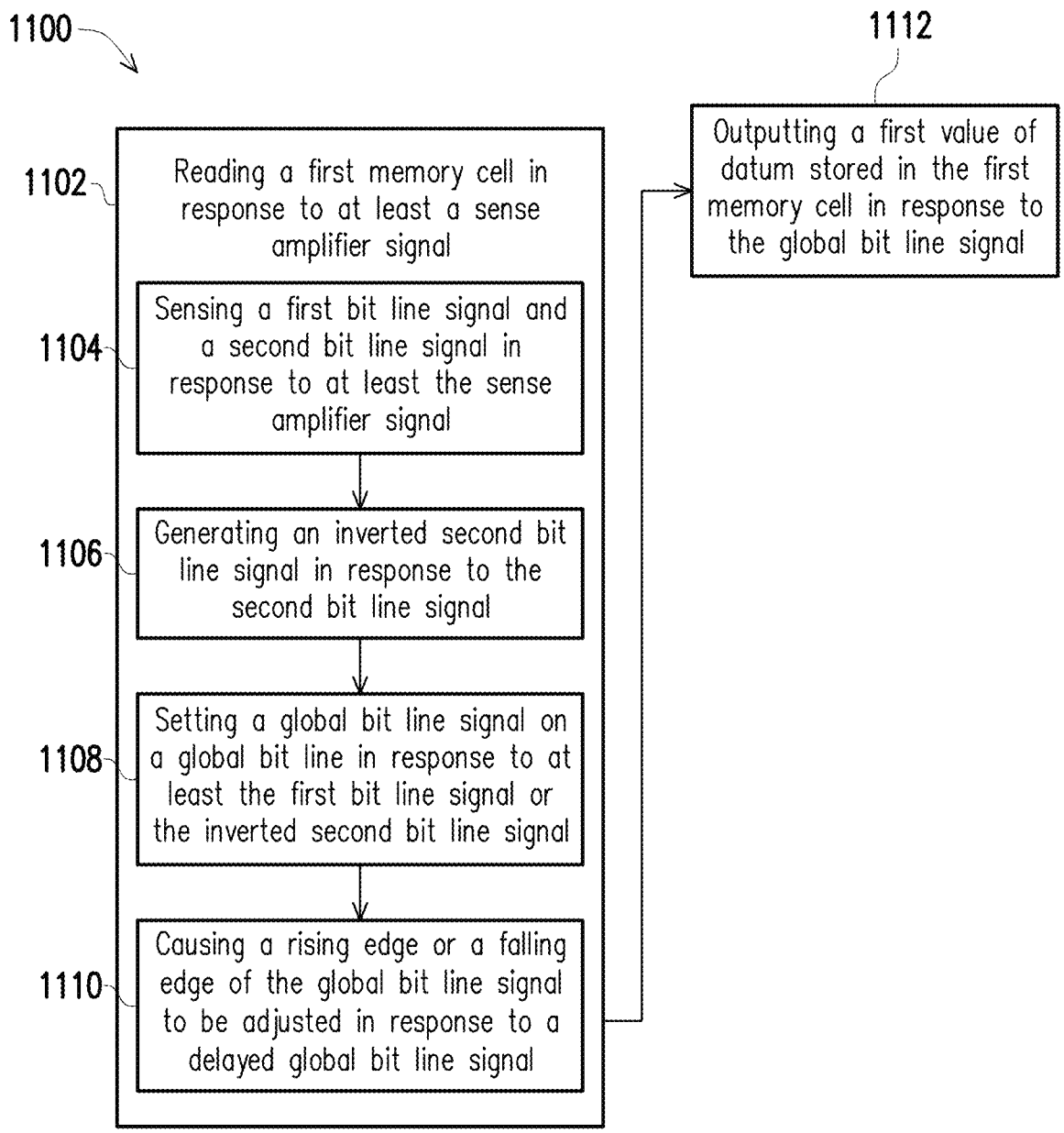
FIG. 11 is a flowchart of a method of operating a circuit, in accordance with some embodiments.

FIG. 11 is a flowchart of a method 1100 of operating a circuit, in accordance with some embodiments.

In some embodiments, FIG. 11 is a flowchart of a method of operating at least one of memory circuit 100 of FIG. 1, memory circuit 200 of FIG. 2, memory circuit 400 of FIG. 4, memory circuit 600, 700, 800A, 800B or 900 of corresponding FIGS. 6-9 or memory cell 300 of FIG. 3.

It is understood that additional operations may be performed before, during, and/or after the method 1100 depicted in FIG. 11, and that some other operations may only be briefly described herein. It is understood that method 1100 utilizes features of one or more of memory circuit 100, memory circuit 200, memory circuit 400, memory circuit 600, 700, 800A, 800B or 900 or memory cell 300, and similar detailed description is omitted for brevity.

In some embodiments, other order of operations of method 1100 is within the scope of the present disclosure. Method 1100 includes exemplary operations, but the operations are not necessarily performed in the order shown. Operations may be added, replaced, changed order, and/or eliminated as appropriate, in accordance with the spirit and scope of disclosed embodiments. In some embodiments, one or more of the operations of method 1100 is not performed.

In operation 1102 of method 1100, a first memory cell is read in response to at least a sense amplifier signal SAE. In some embodiments, the first memory cell is read by an LIO circuit.

In some embodiments, the first memory cell includes at least one of memory cell 112, or one or more memory cells in at least memory cell array 210a, 210b or 110AR.

In some embodiments, the LIO circuit includes at least one of LIO circuit LIO circuit 110BS, LIO circuit 210BS, LIO circuit 402, LIO circuit 602, LIO circuit 702 or LIO circuit 802.

In some embodiments, operation 1102 includes at least one of operation 1104, 1106, 1108 or 1110.

In operation 1104 of method 1100, a first bit line signal and a second bit line signal are sensed in response to at least the sense amplifier signal.

In some embodiments, the first bit line signal includes bit line bar signal RBLB, and the second bit line signal includes bit line signal RBL. In some embodiments, the second bit line signal includes bit line bar signal RBLB, and the first bit line signal includes bit line signal RBL.

In some embodiments, the first bit line signal and the second bit line signal are sensed by a sense amplifier 420. In some embodiments, the sense amplifier is coupled to the first memory cell.

In operation 1106 of method 1100, an inverted second bit line signal is generated in response to the second bit line signal.

In some embodiments, the inverted second bit line signal includes at least inverted bit line signal RBLN. In some embodiments, the inverted second bit line signal corresponds to the first bit line signal.

In some embodiments, the inverted second bit line signal is generated by a first inverter. In some embodiments, the first inverter includes at least inverter I3. In some embodiments, the first inverter is coupled to the sense amplifier.

In operation 1108 of method 1100, a global bit line signal is set in response to at least the first bit line signal or the inverted second bit line signal.

In some embodiments, the global bit line signal is on a global bit line. In some embodiments, the global bit line signal includes read global bit line signal RGBL' or read global bit line bar signal RGBLB'. In some embodiments, the global bit line includes read global bit line RGBL or read global bit line bar RGBLB.

In some embodiments, the global bit line signal is set by a driver circuit 430. In some embodiments, the driver circuit is coupled to the global bit line, the sense amplifier and the first inverter.

In operation 1110 of method 1100, a rising edge or a falling edge of the global bit line signal is adjusted in response to a delayed global bit line signal.

In some embodiments, the delayed global bit line signal includes at least signal S2.

In some embodiments, the rising edge or the falling edge of the global bit line signal is adjusted by a booster circuit. In some embodiments, the booster circuit includes at least one of booster circuit 206a, 206b, 206c, 206d, 406, 606, 706 or 806.

Figure 12:
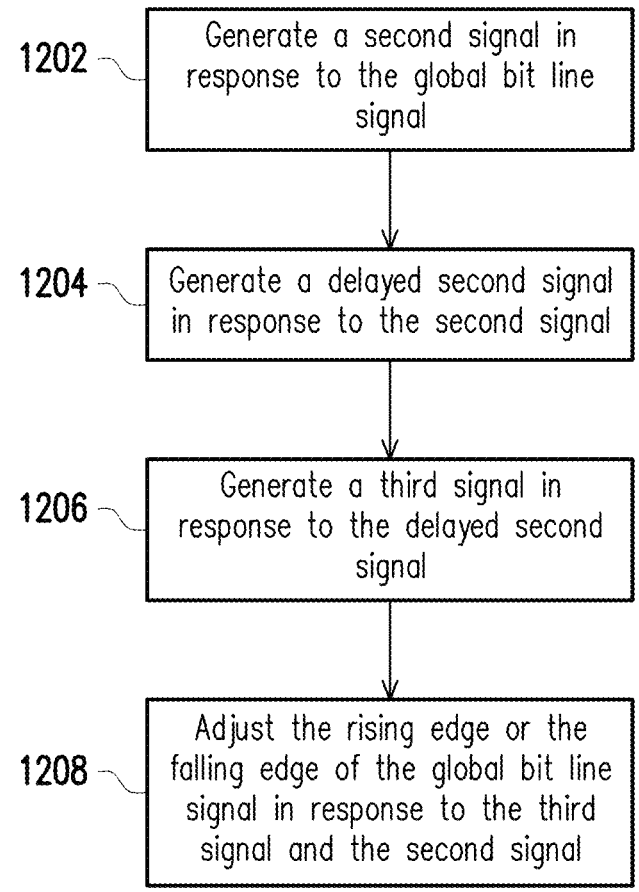
FIG. 12 is a flowchart of a method of operating a circuit, in accordance with some embodiments.

In some embodiments, operation 1110 includes at least one of operation 1202, 1204, 1206 or 1208 of method 1200 (shown in FIG. 12).

In operation 1112 of method 1100, at least a first value of datum stored in the first memory cell is output in response to the global bit line signal.

In some embodiments, the first value of datum stored in the first memory cell is output by GIO circuit 100BL. In some embodiments, the first value of datum stored in the first memory cell is output by GIO circuit 404. In some embodiments, the GIO circuit is coupled to the global bit line. In some embodiments, the first value of datum stored in the first memory cell is a logic 1 or a logic 0.

FIG. 12 is a flowchart of a method 1200 of operating a circuit, in accordance with some embodiments.

In some embodiments, method 1200 is an embodiment of operation 1110 of method 1100 of FIG. 11, and similar detailed description is omitted for brevity.

In some embodiments, FIG. 12 is a flowchart of a method of operating at least one of memory circuit 100 of FIG. 1, memory circuit 200 of FIG. 2, memory circuit 400 of FIG. 4, memory circuit 600, 700, 800A, 800B or 900 of corresponding FIGS. 6-9 or memory cell 300 of FIG. 3.

It is understood that additional operations may be performed before, during, and/or after the method 1200 depicted in FIG. 12, and that some other operations may only be briefly described herein. It is understood that method 1200 utilizes features of one or more of memory circuit 100, memory circuit 200, memory circuit 400, memory circuit 600, 700, 800A, 800B or 900 or memory cell 300, and similar detailed description is omitted for brevity.

In some embodiments, other order of operations of method 1200 is within the scope of the present disclosure. Method 1200 includes exemplary operations, but the operations are not necessarily performed in the order shown. Operations may be added, replaced, changed order, and/or eliminated as appropriate, in accordance with the spirit and scope of disclosed embodiments. In some embodiments, one or more of the operations of method 1200 is not performed.

In operation 1202 of method 1200, a second signal is generated in response to the global bit line signal.

In some embodiments, the second signal includes signal RGBL' or RGBLB'.

In some embodiments, the second signal is generated by a first inverter. In some embodiments, the first inverter includes inverter I1. In some embodiments, the first inverter is coupled to the global bit line.

In operation 1204 of method 1200, a delayed second signal is generated in response to the second signal.

In some embodiments, the delayed second signal includes signal S1.

In some embodiments, the delayed second signal is generated by a delay circuit. In some embodiments, the delay circuit includes at least one of delay circuit 410, 610 or 710 or conductive path 412. In some embodiments, the delay circuit is coupled to the first inverter.

In operation 1206 of method 1200, a third signal is generated in response to the delayed second signal.

In some embodiments, the third signal includes signal S2. In some embodiments, the third signal corresponds to the delayed global bit line signal.

In some embodiments, the third signal is generated by a second inverter. In some embodiments, the second inverter includes inverter I2. In some embodiments, the second inverter is coupled to the delay circuit.

In operation 1208 of method 1200, the rising edge or the falling edge of the global bit line signal is adjusted in response to the third signal and the second signal.

In some embodiments, the rising edge or the falling edge of the global bit line signal is adjusted in response to a transition of the global bit line signal or the global bit line bar signal caused by driver circuit 402.

In some embodiments, the rising edge or the falling edge of the global bit line signal is adjusted by a feedback circuit. In some embodiments, the feedback circuit includes at least one of feedback circuit 416 or 816. In some embodiments, the feedback circuit includes at least one of PMOS transistors MP1, PMOS transistor MP2, NMOS transistor MN1, NMOS transistor MN2 or NMOS transistor MN4. In some embodiments, the feedback circuit is coupled between the second inverter and the global bit line.

While method 1100 and 1200 are described with respect to the global bit line GBL and the global bit line signal GBL', at least one of method 1100 or 1200 is similarly applicable to the global bit line bar GBLB and the global bit line bar signal GBLB', and similar detailed description is omitted for brevity.

By operating at least one of method 1100 or 1200, the circuit operates to achieve the benefits discussed above with respect to at least one of memory circuit 100 of FIG. 1, memory circuit 200 of FIG. 2, memory circuit 400 of FIG. 4, memory circuit 600, 700, 800A, 800B or 900 of corresponding FIGS. 6-9 or memory cell 300 of FIG. 3.

In some embodiments, one or more of the operations of at least one of method 1100 or 1200 is not performed. Furthermore, various PMOS or NMOS transistors shown in FIGS. 3-4 and 6-8 are of a particular dopant type (e.g., N-type or P-type) are for illustration purposes. Embodiments of the disclosure are not limited to a particular transistor type, and one or more of the PMOS or NMOS transistors shown in FIGS. 3-4 and 6-8 can be substituted with a corresponding transistor of a different transistor/ dopant type. Similarly, the low or high logical value of various signals used in the above description is also for illustration. Embodiments of the disclosure are not limited to a particular logical value when a signal is activated and/or deactivated. Selecting different logical values is within the scope of various embodiments. Selecting different numbers of inverters or buffers in FIGS. 3-4 and 6-8 is within the scope of various embodiments. Selecting different numbers of transistors in FIGS. 3-4 and 6-8 is within the scope of various embodiments. Selecting different numbers of delay circuits in FIG. 3-12 is within the scope of various embodiments.

It will be readily seen by one of ordinary skill in the art that one or more of the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

One aspect of this description relates to a memory circuit. The memory circuit includes a set of memory cells configured to store data, and a local input output (LIO) circuit coupled to a global bit line and the set of memory cells. The LIO circuit includes a sense amplifier, a driver circuit and a booster circuit. The sense amplifier is configured to sense a first signal in response to at least a sense amplifier signal. The first signal corresponds to a value of the data stored in the set of memory cells. The driver circuit is configured to generate a global bit line signal in response to at least the first signal or an inverted first signal. The booster circuit is coupled to the driver circuit and the global bit line, and configured to adjust the global bit line signal in response to a delayed global bit line signal. In some embodiments, the booster circuit further includes a first inverter configured to generate a second signal in response to the global bit line signal, the first inverter including a first input terminal coupled to the global bit line, and a first output terminal. In some embodiments, the booster circuit further includes a delay circuit coupled to the first output terminal of the first inverter, and configured to generate a delayed second signal in response to the second signal. In some embodiments, the booster circuit further includes a second inverter configured to generate a third signal in response to the delayed second signal, the second inverter including a second input terminal and a second output terminal, the second input terminal being coupled to an output terminal of the delay circuit, the third signal corresponds to the delayed global bit line signal. In some embodiments, the booster circuit further includes a feedback circuit coupled between the second output terminal of the second inverter and the global bit line, and configured to adjust the global bit line signal in response to the third signal and the second signal. In some embodiments, the feedback circuit further includes a first P-type transistor having a first source coupled to a first voltage supply, a first gate of the first P-type transistor is configured to receive the third signal and is coupled to the second output terminal of the second inverter, and a first drain of the first P-type transistor is coupled with at least a first node. In some embodiments, the feedback circuit further includes a second P-type transistor having a second source coupled with the first drain of the first P-type transistor and the first node, a second gate of the second P-type transistor is configured to receive the second signal and is coupled to the first output terminal of the first inverter, and a second drain of the second P-type transistor is coupled with at least the global bit line by a second node. In some embodiments, the feedback circuit further includes a first N-type transistor having a third source coupled to at least a third node, a third gate of the first N-type transistor is configured to receive the second signal and is coupled to the first output terminal of the first inverter and the second gate of the second P-type transistor, and a third drain of the first N-type transistor is coupled with at least the second drain of the second P-type transistor, the global bit line and the second node. In some embodiments, the feedback circuit further includes a second N-type transistor having a fourth source coupled to at least a fourth node, a fourth gate of the second N-type transistor is configured to receive the third signal and is coupled to the second output terminal of the second inverter and the first gate of the first P-type transistor, and a fourth drain of the second N-type transistor is coupled with the third source of the first N-type transistor and the third node. In some embodiments, the feedback circuit further includes a third N-type transistor having a fifth source coupled to a reference voltage supply, a fifth gate of the third N-type transistor is configured to receive the sense amplifier signal, and a fifth drain of the third N-type transistor is coupled with the fourth source of the second N-type transistor and the fourth node. In some embodiments, the fourth source of the second N-type transistor and the fourth node are coupled to a reference voltage supply. In some embodiments, the delay circuit includes a third inverter configured to generate a first intermediate signal in response to the second signal, the third inverter including a third input terminal coupled to the first output terminal of the first inverter, and a third output terminal. In some embodiments, the delay circuit further includes a fourth inverter configured to generate the delayed second signal in response to the first intermediate signal, the fourth inverter including a fourth input terminal coupled to the third output terminal of the third inverter, and a fourth output terminal coupled to the second input terminal of the second inverter. In some embodiments, the delay circuit includes a first buffer configured to generate the delayed second signal in response to the second signal, the first buffer including a third input terminal coupled to the first output terminal of the first inverter, and a third output terminal coupled to the second input terminal of the second inverter. In some embodiments, the memory circuit further includes a global input output (GIO) circuit coupled to the LIO circuit and the global bit line, and configured to output the value of the data stored in a memory cell of the set of memory cells in response to the global bit line signal. In some embodiments, the GIO circuit includes a first inverter configured to generate the value of the data stored in the memory cell in response to the global bit line signal, the first inverter including a first input terminal coupled to the global bit line, and a first output terminal configured to output the value of the data stored in the memory cell. In some embodiments, the GIO circuit further includes a latch circuit configured to latch the global bit line signal in response to at least an enable signal, and being coupled to the global bit line and the first inverter. In some embodiments, the latch circuit includes a second inverter configured to generate a first intermediate signal in response to the global bit line signal, the second inverter including a second input terminal coupled to the global bit line, and a second output terminal configured to output the first intermediate signal. In some embodiments, the latch circuit further includes a third inverter configured to generate a latched global bit line signal in response to the first intermediate signal, the third inverter including a third input terminal coupled to the second output terminal of the second inverter, a first enable terminal configured to receive the enable signal, a second enable terminal configured to receive an inverted enable signal, and a third output terminal coupled to the first input terminal of the first inverter.

Another aspect of this description relates to a memory circuit. The memory circuit includes a global bit line, a set of memory banks including a first memory bank, and a global input output (GIO) circuit. In some embodiments, the first memory bank includes a first set of memory cells configured to store data, and a first local input output (LIO) circuit coupled to the global bit line and the first set of memory cells. In some embodiments, the first LIO circuit includes a first driver circuit and a first booster circuit. In some embodiments, the first driver circuit is coupled to the global bit line, is and configured to adjust a global bit line signal in response to at least a first signal. In some embodiments, the first signal corresponds to a first value of the data stored in a first memory cell of the first set of memory cells. In some embodiments, the first booster circuit is coupled to the global bit line, and is configured to adjust a rising edge or a falling edge of the global bit line signal in response to a first delayed global bit line signal. In some embodiments, the GIO circuit is coupled to the first LIO circuit and the global bit line, and configured to output the first value of the data stored in the first memory cell of the first set of memory cells in response to the global bit line signal. In some embodiments, the first LIO circuit further includes a first sense amplifier coupled to the first driver circuit, and configured to sense a first bit line signal and a second bit line signal in response to at least a first sense amplifier signal, the first signal corresponding to the first bit line signal or the second bit line signal. In some embodiments, the first LIO circuit further includes a first inverter coupled to the first sense amplifier and the first driver circuit, and configured to generate an inverted second bit line signal in response to the second bit line signal, the inverted second bit line signal corresponding to the first bit line signal. In some embodiments, the set of memory banks further includes a second memory bank separated from the first memory bank in a first direction. In some embodiments, the second memory bank includes a second set of memory cells configured to store the data. In some embodiments, the second memory bank further includes a second LIO circuit coupled to the global bit line and the second set of memory cells. In some embodiments, the second LIO circuit includes a second driver circuit coupled to the global bit line, and configured to adjust the global bit line signal in response to at least a third bit line signal, the third bit line signal corresponds to a first value of the data stored in a first memory cell of the second set of memory cells. In some embodiments, the second LIO circuit further includes a second sense amplifier coupled to the second driver circuit, and configured to sense the third bit line signal and a fourth bit line signal in response to at least a second sense amplifier signal. In some embodiments, the second LIO circuit further includes a second inverter coupled to the second sense amplifier and the second driver circuit, and configured to generate an inverted fourth bit line signal in response to the fourth bit line signal, the inverted fourth bit line signal corresponding to the third bit line signal. In some embodiments, the first memory bank is located adjacent to the GIO circuit, the second memory bank is located adjacent to a first end of the memory circuit opposite from the GIO circuit, and the second LIO circuit does not include a booster circuit. In some embodiments, the second LIO circuit further includes a second booster circuit coupled to the global bit line, and configured to adjust the rising edge or the falling edge of the global bit line signal in response to a second delayed global bit line signal. In some embodiments, the first memory bank is located adjacent to the GIO circuit, and the second memory bank is located adjacent to a first end of the memory circuit opposite from the GIO circuit. In some embodiments, the first booster circuit includes a first inverter configured to generate a second signal in response to the global bit line signal, the first inverter including a first input terminal coupled to the global bit line, and a first output terminal. In some embodiments, the first booster circuit further includes a delay circuit coupled to the first output terminal of the first inverter, and configured to generate a delayed second signal in response to the second signal. In some embodiments, the first booster circuit further includes a second inverter configured to generate a third signal in response to the delayed second signal, the second inverter including a second input terminal and a second output terminal, the second input terminal being coupled to an output terminal of the delay circuit, the third signal corresponds to the first delayed global bit line signal. In some embodiments, the first booster circuit further includes a feedback circuit coupled between the second output terminal of the second inverter and the global bit line, and configured to adjust the rising edge or the falling edge of the global bit line signal in response to the third signal and the second signal. In some embodiments, the delay circuit includes a third inverter configured to generate a first intermediate signal in response to the second signal, the third inverter including a third input terminal coupled to the first output terminal of the first inverter, and a third output terminal. In some embodiments, the delay circuit further includes a fourth inverter configured to generate the delayed second signal in response to the first intermediate signal, the fourth inverter including a fourth input terminal coupled to the third output terminal of the third inverter, and a fourth output terminal coupled to the second input terminal of the second inverter. In some embodiments, the delay circuit includes a first buffer configured to generate the delayed second signal in response to the second signal, the first buffer including a third input terminal coupled to the first output terminal of the first inverter, and a third output terminal coupled to the second input terminal of the second inverter.

Still another aspect of this description relates to a method of operating a memory circuit. The method includes reading, by a local input output (LIO) circuit, a first memory cell in response to at least a sense amplifier signal and outputting, by a global input output (GIO) circuit a first value of datum stored in a first memory cell in response to the global bit line signal, the GIO circuit being coupled to a global bit line. In some embodiments, reading the first memory cell includes sensing, by a sense amplifier, a first bit line signal and a second bit line signal in response to at least the sense amplifier signal, the sense amplifier being coupled to the first memory cell. In some embodiments, reading the first memory cell further includes generating, by a first inverter, an inverted second bit line signal in response to the second bit line signal, the inverted second bit line signal corresponding to the first bit line signal, the first inverter being coupled to the sense amplifier. In some embodiments, reading the first memory cell further includes setting, by a driver circuit, a global bit line signal on a global bit line in response to at least the first bit line signal or the inverted second bit line signal, the driver circuit being coupled to the global bit line, the sense amplifier and the first inverter. In some embodiments, reading the first memory cell further includes causing, by a booster circuit, a rising edge or a falling edge of the global bit line signal to be adjusted in response to a delayed global bit line signal.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory circuit comprising:
   a set of memory cells configured to store data; and
   a local input output (LIO) circuit coupled to a global bit line and the set of memory cells, the LIO circuit comprising:
      a sense amplifier configured to sense a first signal in response to at least a sense amplifier signal, the first signal corresponding to a value of the data stored in the set of memory cells;
      a driver circuit configured to generate a global bit line signal in response to at least the first signal or an inverted first signal; and
      a booster circuit coupled to the driver circuit and the global bit line, and configured to adjust the global bit line signal in response to a delayed global bit line signal, wherein the booster circuit comprises:
         a first inverter configured to generate a second signal in response to the global bit line signal, the first inverter including a first input terminal coupled to the global bit line, and a first output terminal;
         a delay circuit coupled to the first output terminal of the first inverter, and configured to generate a delayed second signal in response to the second signal; and
         a second inverter configured to generate a third signal in response to the delayed second signal, the second inverter including a second input terminal and a second output terminal, the second input terminal being coupled to an output terminal of the delay circuit, the third signal corresponds to the delayed global bit line signal.

2. The memory circuit of claim 1, wherein the booster circuit further comprises:
   a feedback circuit coupled between the second output terminal of the second inverter and the global bit line, and configured to adjust the global bit line signal in response to the third signal and the second signal.

3. The memory circuit of claim 2, wherein the feedback circuit comprises:
   a first P-type transistor having a first source coupled to a first voltage supply, a first gate of the first P-type transistor is configured to receive the third signal and is coupled to the second output terminal of the second inverter, and a first drain of the first P-type transistor is coupled with at least a first node;
   a second P-type transistor having a second source coupled with the first drain of the first P-type transistor and the first node, a second gate of the second P-type transistor is configured to receive the second signal and is coupled to the first output terminal of the first inverter, and a second drain of the second P-type transistor is coupled with at least the global bit line by a second node;
   a first N-type transistor having a third source coupled to at least a third node, a third gate of the first N-type transistor is configured to receive the second signal and is coupled to the first output terminal of the first inverter and the second gate of the second P-type transistor, and a third drain of the first N-type transistor is coupled with at least the second drain of the second P-type transistor, the global bit line and the second node; and
   a second N-type transistor having a fourth source coupled to at least a fourth node, a fourth gate of the second N-type transistor is configured to receive the third signal and is coupled to the second output terminal of the second inverter and the first gate of the first P-type transistor, and a fourth drain of the second N-type transistor is coupled with the third source of the first N-type transistor and the third node.

4. The memory circuit of claim 3, wherein the feedback circuit further comprises:
   a third N-type transistor having a fifth source coupled to a reference voltage supply, a fifth gate of the third N-type transistor is configured to receive the sense amplifier signal, and a fifth drain of the third N-type transistor is coupled with the fourth source of the second N-type transistor and the fourth node.

5. The memory circuit of claim 3, wherein the fourth source of the second N-type transistor and the fourth node are coupled to a reference voltage supply.

6. The memory circuit of claim 2, wherein the delay circuit comprises:
   a third inverter configured to generate a first intermediate signal in response to the second signal, the third inverter including a third input terminal coupled to the first output terminal of the first inverter, and a third output terminal; and
   a fourth inverter configured to generate the delayed second signal in response to the first intermediate signal, the fourth inverter including a fourth input terminal coupled to the third output terminal of the third inverter, and a fourth output terminal coupled to the second input terminal of the second inverter.

7. The memory circuit of claim 2, wherein the delay circuit comprises:
   a first buffer configured to generate the delayed second signal in response to the second signal, the first buffer including a third input terminal coupled to the first output terminal of the first inverter, and a third output terminal coupled to the second input terminal of the second inverter.

8. The memory circuit of claim 1, further comprising:
   a global input output (GIO) circuit coupled to the LIO circuit and the global bit line, and configured to output the value of the data stored in a memory cell of the set of memory cells in response to the global bit line signal.

9. The memory circuit of claim 8, wherein the GIO circuit comprises:
   a third inverter configured to generate the value of the data stored in the memory cell in response to the global bit line signal, the third inverter including a third input terminal coupled to the global bit line, and a third output terminal configured to output the value of the data stored in the memory cell; and
   a latch circuit configured to latch the global bit line signal in response to at least an enable signal, and being coupled to the global bit line and the third inverter.

10. The memory circuit of claim 9, wherein the latch circuit comprises:
   a fourth inverter configured to generate a first intermediate signal in response to the global bit line signal, the fourth inverter including a fourth input terminal coupled to the global bit line, and a fourth output terminal configured to output the first intermediate signal; and
   a fifth inverter configured to generate a latched global bit line signal in response to the first intermediate signal, the fifth inverter including a fifth input terminal coupled to the fourth output terminal of the fourth inverter, a first enable terminal configured to receive the enable signal, a second enable terminal configured to receive an inverted enable signal, and a fifth output terminal coupled to the third input terminal of the third inverter.

11. A memory circuit comprising:
a global bit line;
a set of memory banks including a first memory bank, the first memory bank comprising:
 a first set of memory cells configured to store data; and
 a first local input output (LIO) circuit coupled to the global bit line and the first set of memory cells, the first LIO circuit comprising:
  a first driver circuit coupled to the global bit line, and configured to adjust a global bit line signal in response to at least a first signal, the first signal corresponds to a first value of the data stored in a first memory cell of the first set of memory cells; and
  a first booster circuit coupled to the global bit line, and configured to adjust a rising edge or a falling edge of the global bit line signal in response to a first delayed global bit line signal; and
a global input output (GIO) circuit coupled to the first LIO circuit and the global bit line, and configured to output the first value of the data stored in the first memory cell of the first set of memory cells in response to the global bit line signal,
wherein the first booster circuit comprises:
 a first inverter configured to generate a second signal in response to the global bit line signal, the first inverter including a first input terminal coupled to the global bit line, and a first output terminal;
 a delay circuit coupled to the first output terminal of the first inverter, and configured to generate a delayed second signal in response to the second signal; and
 a second inverter configured to generate a third signal in response to the delayed second signal, the second inverter including a second input terminal and a second output terminal, the second input terminal being coupled to an output terminal of the delay circuit, the third signal corresponds to the first delayed global bit line signal.

12. The memory circuit of claim 11, wherein the first LIO circuit further comprises:
a first sense amplifier coupled to the first driver circuit, and configured to sense a first bit line signal and a second bit line signal in response to at least a first sense amplifier signal, the first signal corresponding to the first bit line signal or the second bit line signal; and
a third inverter coupled to the first sense amplifier and the first driver circuit, and configured to generate an inverted second bit line signal in response to the second bit line signal, the inverted second bit line signal corresponding to the first bit line signal.

13. The memory circuit of claim 12, wherein the set of memory banks further comprises:
a second memory bank separated from the first memory bank in a first direction, wherein the second memory bank comprises:
 a second set of memory cells configured to store the data; and
 a second LIO circuit coupled to the global bit line and the second set of memory cells, the second LIO circuit comprising:
  a second driver circuit coupled to the global bit line, and configured to adjust the global bit line signal in response to at least a third bit line signal, the third bit line signal corresponds to a first value of the data stored in a first memory cell of the second set of memory cells;
  a second sense amplifier coupled to the second driver circuit, and configured to sense the third bit line signal and a fourth bit line signal in response to at least a second sense amplifier signal; and
  a fourth inverter coupled to the second sense amplifier and the second driver circuit, and configured to generate an inverted fourth bit line signal in response to the fourth bit line signal, the inverted fourth bit line signal corresponding to the third bit line signal.

14. The memory circuit of claim 13, wherein
the first memory bank is located adjacent to the GIO circuit;
the second memory bank is located adjacent to a first end of the memory circuit opposite from the GIO circuit; and
the second LIO circuit does not include a booster circuit.

15. The memory circuit of claim 13, wherein the second LIO circuit further comprises:
a second booster circuit coupled to the global bit line, and configured to adjust the rising edge or the falling edge of the global bit line signal in response to a second delayed global bit line signal.

16. The memory circuit of claim 15, wherein
the first memory bank is located adjacent to the GIO circuit; and
the second memory bank is located adjacent to a first end of the memory circuit opposite from the GIO circuit.

17. The memory circuit of claim 11, wherein the first booster circuit further comprises:
a feedback circuit coupled between the second output terminal of the second inverter and the global bit line, and configured to adjust the rising edge or the falling edge of the global bit line signal in response to the third signal and the second signal.

18. The memory circuit of claim 17, wherein the delay circuit comprises:
a third inverter configured to generate a first intermediate signal in response to the second signal, the third inverter including a third input terminal coupled to the first output terminal of the first inverter, and a third output terminal; and
a fourth inverter configured to generate the delayed second signal in response to the first intermediate signal, the fourth inverter including a fourth input terminal coupled to the third output terminal of the third inverter, and a fourth output terminal coupled to the second input terminal of the second inverter.

19. The memory circuit of claim 17, wherein the delay circuit comprises:
a first buffer configured to generate the delayed second signal in response to the second signal, the first buffer including a third input terminal coupled to the first output terminal of the first inverter, and a third output terminal coupled to the second input terminal of the second inverter.

20. A method of operating a memory circuit, the method comprising:
reading, by a local input output (LIO) circuit, a first memory cell in response to at least a sense amplifier signal, wherein reading the first memory cell comprises:
 sensing, by a sense amplifier, a first bit line signal and a second bit line signal in response to at least the sense amplifier signal, the sense amplifier being coupled to the first memory cell;

generating, by a first inverter, an inverted second bit line signal in response to the second bit line signal, the inverted second bit line signal corresponding to the first bit line signal, the first inverter being coupled to the sense amplifier;

setting, by a driver circuit, a global bit line signal on a global bit line in response to at least the first bit line signal or the inverted second bit line signal, the driver circuit being coupled to the global bit line, the sense amplifier and the first inverter; and causing, by a booster circuit, a rising edge or a falling edge of the global bit line signal to be adjusted in response to a delayed global bit line signal; and outputting, by a global input output (GIO) circuit a first value of datum stored in the first memory cell in response to the global bit line signal, the GIO circuit being coupled to the global bit line;

wherein the booster circuit comprises:

a second inverter configured to generate a first signal in response to the global bit line signal, the second inverter including a first input terminal coupled to the global bit line, and a first output terminal;

a delay circuit coupled to the first output terminal of the second inverter, and configured to generate a delayed first signal in response to the first signal; and a third inverter configured to generate a second signal in response to the delayed first signal, the third inverter including a second input terminal and a second output terminal, the second input terminal being coupled to an output terminal of the delay circuit, the second signal corresponds to the delayed global bit line signal.

* * * * *